United States Patent
Samuelson et al.

(10) Patent No.: US 9,680,039 B2
(45) Date of Patent: *Jun. 13, 2017

(54) NANOSTRUCTURES AND METHODS FOR MANUFACTURING THE SAME

(71) Applicant: QuNano AB, Lund (SE)

(72) Inventors: Lars Ivar Samuelson, Malmo (SE); Bjorn Jonas Ohlsson, Malmo (SE)

(73) Assignee: QUNANO AB, Lund (SE)

( * ) Notice: Subject to any disclaimer, the term of this patent is extended or adjusted under 35 U.S.C. 154(b) by 0 days.

This patent is subject to a terminal disclaimer.

(21) Appl. No.: 14/300,614

(22) Filed: Jun. 10, 2014

(65) Prior Publication Data

US 2015/0027523 A1    Jan. 29, 2015

Related U.S. Application Data

(62) Division of application No. 12/003,740, filed on Dec. 31, 2007, now Pat. No. 8,772,626, which is a division
(Continued)

(51) Int. Cl.
*H01L 31/0352*  (2006.01)
*B82Y 10/00*  (2011.01)
(Continued)

(52) U.S. Cl.
CPC ...... *H01L 31/035227* (2013.01); *B82Y 10/00* (2013.01); *C30B 11/00* (2013.01);
(Continued)

(58) Field of Classification Search
CPC  C30B 11/00; C30B 11/12; C30B 5/00; C30B 25/02; C30B 25/14; C30B 25/18; C30B 25/183; C30B 29/403; C30B 29/406; C30B 29/605; C30B 29/0665; C30B 29/0673; C30B 29/068; C30B 29/20; C30B 29/66318; C30B 29/7371; H01L 31/035227; H01L 29/0665; H01L 29/0673;
(Continued)

(56) References Cited

U.S. PATENT DOCUMENTS 5,196,396 A    3/1993   Lieber
5,252,835 A   10/1993   Lieber et al.
(Continued)

FOREIGN PATENT DOCUMENTS

EP    0 443 920    8/1991
EP    0 838 865    4/1998
(Continued)

OTHER PUBLICATIONS

U.S. Appl. No. 12/003,738, filed Dec. 31, 2007, Samuelson et al.
(Continued)

*Primary Examiner* — Xiuyu Tai
(74) *Attorney, Agent, or Firm* — The Marbury Law Group PLLC

(57) ABSTRACT

A resonant tunneling diode, and other one dimensional electronic, photonic structures, and electromechanical MEMS devices, are formed as a heterostructure in a nanowhisker by forming length segments of the whisker with different materials having different band gaps.

5 Claims, 18 Drawing Sheets

Related U.S. Application Data of application No. 10/613,071, filed on Jul. 7, 2003, now Pat. No. 7,335,908.

(60) Provisional application No. 60/393,835, filed on Jul. 8, 2002, provisional application No. 60/459,982, filed on Apr. 4, 2003.

(51) Int. Cl.

| | | |
|---|---|---|
| *C30B 11/00* | (2006.01) | |
| *C30B 11/12* | (2006.01) | |
| *C30B 25/00* | (2006.01) | |
| *C30B 25/02* | (2006.01) | |
| *C30B 25/14* | (2006.01) | |
| *C30B 25/18* | (2006.01) | |
| *C30B 29/40* | (2006.01) | |
| *C30B 29/60* | (2006.01) | |
| *H01L 29/06* | (2006.01) | |
| *H01L 29/20* | (2006.01) | |
| *H01L 29/66* | (2006.01) | |
| *H01L 29/737* | (2006.01) | |
| *H01L 29/88* | (2006.01) | |
| *H01L 33/04* | (2010.01) | |
| *H01L 31/0224* | (2006.01) | |
| *H01L 31/048* | (2014.01) | |
| *H01L 31/068* | (2012.01) | |

(52) U.S. Cl.
CPC .............. *C30B 11/12* (2013.01); *C30B 25/00* (2013.01); *C30B 25/02* (2013.01); *C30B 25/14* (2013.01); *C30B 25/18* (2013.01); *C30B 25/183* (2013.01); *C30B 29/403* (2013.01); *C30B 29/406* (2013.01); *C30B 29/605* (2013.01); *H01L 29/068* (2013.01); *H01L 29/0665* (2013.01); *H01L 29/0673* (2013.01); *H01L 29/20* (2013.01); *H01L 29/66318* (2013.01); *H01L 29/7371* (2013.01); *H01L 29/882* (2013.01); *H01L 31/022466* (2013.01); *H01L 31/048* (2013.01); *H01L 31/068* (2013.01); *H01L 33/04* (2013.01); *Y02E 10/547* (2013.01); *Y10S 977/762* (2013.01); *Y10S 977/763* (2013.01)

(58) Field of Classification Search
CPC . H01L 29/068; H01L 29/20; H01L 29/66318; H01L 29/7371; H01L 31/035281; H01L 51/4213; H01L 51/426; H01L 51/4266; H01L 51/5012; H01L 51/5048; H01L 51/0038; H01L 2251/5369; B82Y 10/00; Y10S 977/932; Y10S 977/778; Y10S 977/72; Y10S 977/789; Y10T 428/24996; Y10T 428/31678; Y10T 428/249967; Y10T 428/24

See application file for complete search history.

(56) References Cited

U.S. PATENT DOCUMENTS

| | | | |
|---|---|---|---|
| 5,296,719 | A | 3/1994 | Hirai et al. |
| 5,332,910 | A | 7/1994 | Haraguchi et al. |
| 5,362,972 | A | 11/1994 | Yazawa et al. |
| 5,381,753 | A | 1/1995 | Okajima et al. |
| 5,544,617 | A | 8/1996 | Terui et al. |
| 5,674,793 | A | 10/1997 | Hirao et al. |
| 5,705,449 | A | 1/1998 | Hirao et al. |
| 5,811,832 | A | 9/1998 | Alphenaar et al. |
| 5,840,435 | A | 11/1998 | Lieber et al. |
| 5,858,862 | A | 1/1999 | Westwater et al. |
| 5,897,945 | A | 4/1999 | Lieber et al. |
| 5,899,734 | A | 5/1999 | Lee |
| 5,976,957 | A | 11/1999 | Westwater et al. |
| 5,997,832 | A | 12/1999 | Lieber et al. |
| 6,036,773 | A | 3/2000 | Wang et al. |
| 6,130,142 | A | 10/2000 | Westwater et al. |
| 6,130,143 | A | 10/2000 | Westwater et al. |
| 6,159,742 | A | 12/2000 | Lieber et al. |
| 6,190,634 | B1 | 2/2001 | Lieber et al. |
| 6,286,226 | B1 | 9/2001 | Jin |
| 6,307,241 | B1 | 10/2001 | Awschalom et al. |
| 6,322,713 | B1 | 11/2001 | Choi et al. |
| 6,340,822 | B1 | 1/2002 | Brown et al. |
| 6,559,468 | B1 | 5/2003 | Kuekes et al. |
| 6,586,965 | B2 | 7/2003 | Kuekes |
| 6,716,409 | B2 | 4/2004 | Hafner et al. |
| 6,743,408 | B2 | 6/2004 | Lieber et al. |
| 6,759,693 | B2 | 7/2004 | Vogeli et al. |
| 6,813,077 | B2 | 11/2004 | Borrelli et al. |
| 6,855,202 | B2 | 2/2005 | Alivisatos et al. |
| 6,996,147 | B2 | 2/2006 | Majumdar et al. |
| 7,014,737 | B2 | 3/2006 | Harutyunyan et al. |
| 7,084,507 | B2 | 8/2006 | Awano |
| 7,208,094 | B2 | 4/2007 | Islam et al. |
| 7,223,444 | B2 | 5/2007 | Deppert et al. |
| 7,335,908 | B2 | 2/2008 | Samuelson et al. |
| 7,354,850 | B2 | 4/2008 | Seifert et al. |
| 7,682,943 | B2 | 3/2010 | Samuelson et al. |
| 7,745,813 | B2 | 6/2010 | Samuelson et al. |
| 7,911,035 | B2 | 3/2011 | Seifert et al. |
| 8,049,203 | B2 | 11/2011 | Samuelson et al. |
| 8,183,587 | B2 | 5/2012 | Samuelson et al. |
| 8,330,143 | B2 | 12/2012 | Wernersson et al. |
| 8,344,361 | B2 | 1/2013 | Wernersson et al. |
| 8,450,717 | B1 | 5/2013 | Samuelson et al. |
| 2002/0129761 | A1 | 9/2002 | Takami |
| 2002/0130311 | A1 | 9/2002 | Lieber et al. |
| 2002/0172820 | A1 | 11/2002 | Majumdar et al. |
| 2002/0175408 | A1 | 11/2002 | Majumdar et al. |
| 2002/0192441 | A1* | 12/2002 | Kalkan ............... H01L 51/4213 428/209 |
| 2003/0089899 | A1 | 5/2003 | Lieber et al. |
| 2003/0102444 | A1 | 6/2003 | Deppert et al. |
| 2003/0121764 | A1 | 7/2003 | Yang et al. |
| 2003/0200521 | A1 | 10/2003 | DeHon et al. |
| 2004/0003838 | A1 | 1/2004 | Curtin |
| 2004/0075464 | A1 | 4/2004 | Samuelson et al. |
| 2004/0213307 | A1 | 10/2004 | Lieber et al. |
| 2005/0006673 | A1 | 1/2005 | Samuelson et al. |
| 2005/0011431 | A1 | 1/2005 | Samuelson et al. |
| 2005/0017171 | A1 | 1/2005 | Samuelson et al. |
| 2006/0057360 | A1 | 3/2006 | Samuelson |
| 2006/0125056 | A1 | 6/2006 | Samuelson et al. |
| 2007/0206488 | A1 | 9/2007 | Thelander et al. |
| 2007/0228583 | A1 | 10/2007 | Islam et al. |
| 2008/0105296 | A1 | 5/2008 | Samuelson et al. |

FOREIGN PATENT DOCUMENTS

| | | |
|---|---|---|
| EP | 1 314 189 | 5/2003 |
| EP | 1 342 075 | 9/2003 |
| JP | 04-296060 | 10/1992 |
| JP | 1993-009099 | 1/1993 |
| JP | 1993-085899 | 4/1993 |
| JP | 1995-211951 | 8/1995 |
| JP | 1996-143400 | 6/1996 |
| JP | 1999-060389 | 3/1999 |
| JP | 2000-068493 | 3/2000 |
| WO | WO 95/02709 | 1/1995 |
| WO | WO 97/31139 | 8/1997 |
| WO | WO 01/03208 | 1/2001 |
| WO | WO 01/77726 | 10/2001 |
| WO | WO 01/84238 | 11/2001 |
| WO | WO 02/01648 | 1/2002 |
| WO | WO 02/17362 A2 | 2/2002 |
| WO | WO 02/48701 A2 | 6/2002 |
| WO | WO 02/080280 | 10/2002 |
| WO | WO 03/005450 | 1/2003 |
| WO | WO 03/053851 | 7/2003 |

(56) References Cited

FOREIGN PATENT DOCUMENTS

| WO | WO 03/063208 | 7/2003 |
|---|---|---|
| WO | WO 2004/010552 | 1/2004 |
| WO | WO 2004/038767 | 5/2004 |

OTHER PUBLICATIONS

Yazawa, M. et al, "Heteroepitaxial Ultrafine Wire-Like Growth of InAs on GaAs Substrates", *Applied Physics Letters*, Mar. 11, 1991, pp. 1080-1082, vol. 58, No. 10.

Haraguchi, K. et al., "GaAs p-n junction formed in quantum wire crystals", *Applied Physics Letters*, Feb. 10, 1992, pp. 745-747, vol. 60, No. 6.

Yazawa, M., et al., "Effect of one monolayer of surface gold atoms on the epitaxial growth of InAs nanowhiskers", *Applied Physics Letters*, Oct. 26, 1992, pp. 2051-2053, vol. 61.

Yazawa, M., "Nanocolumns composed of GaAs—InAs jointed whiskers and SiO2 covers", *Applied Physics Letters*, Aug. 29, 1994, pp. 1157-1158, vol. 65.

Sato, T., "Site-controlled growth of nanowhiskers", *Applied Physics Letters*, Jan. 9, 1995, pp. 159-161, vol. 66.

Hiruma, K., et al., "Growth and optical properties of nanometerscale GaAs and InAs whiskers", *Applied Physics Review*, Jan. 15, 1995, pp. 447-462, vol. 77.

Hiruma, K., et al., "Growth and Characterization of Nanometer-Scale GaAs, AiGaAs and GaAs/InAs Wires", *IEICE Trans. Electron.*, Sep. 1, 1994, pp. 1420-1425, vol. E77-C, No. 9.

Hiruma, K., et al., "Gas free-standing quantum-size wires", *Journal of Applied Physics*, Sep. 1, 1993, pp. 3162-3171, vol. 74.

Haraguchi, K., et al., "Polarization dependence of light emitted from GaAs p-n junctions in quantum wire crystals", *Journal of Applied Physics*, Apr. 15, 1994, pp. 4220-4225, vol. 75.

Hiruma, K., et al., Self-organized growth of GaAs/InAs heterostructure nanocylinders by organometallic vapor phase epitaxy, *Journal of Crystal Growth*, Jan. 1, 1996, pp. 226-231, vol. 163.

Lieber, C., "Nanowires as Building Blocks for Nanoscale Science and Technology", *Abstracts of Papers of the Amer. Chem Soc.*, Aug. 18, 2002, pp. 033—Camp Part 1, vol. 224.

Duan, X. et al., "Laser Assisted Catalytic Growth of Single-Crystal Compound Semiconductor Nanowires", *Abstracts of Papers of-the Amer. Chem. Soc.*, Mar. 26, 2000, pp. 676—Inor Part 1, vol. 219.

Duan, X. et al., "Laser Assisted Catalytic Growth of Semiconductor Nanowires for Nanoscale Electronic Optoelectronic Device Application", *Abstracts of Papers of-the Amer. Chem. Soc.*, Apr. 1, 2001, pp. 644—Inor Part 1, vol. 221.

Lieber, C., "Semiconductor Nanowires: Building Blocks for Nanoscale Science and Technology", *Abstracts of Papers of-the Amer. Chem. Soc.*, Aug. 1, 2001, pp. 383—Phys Part 2, vol. 222.

Huang, Y., et al., "Integrated Optoelectronics Assembled from Semiconductor Nanowires", *Abstracts of Papers of-the Amer. Chem. Soc.*, Aug. 18, 2002, pp. 039—Phys Part 2, vol. 224.

Hu, J. et al., "Chemistry and Physics in One Dimension: Synthesis and Properties of Nanowires and Nanotubes", *Acc. Chem. Res.*, Feb. 20, 1999, pp. 435-445, vol. 32, No. 5.

Duan, X. et al., "General Synthesis of Compound Semiconductor Nanowires", *Advanced Materials*, Jan. 1, 2000, pp. 298-302, vol. 12, No. 4.

Duan, X., et al., "Synthesis and optical properties of gallium arsenide nanowires", *Applied Physics Letters*, Feb. 28, 2000, pp. 1116-1118, vol. 76, No. 9.

Cui, Y., et al., "Diameter-controlled synthesis of single-crystal silicon nanowires", *Applied Physics Letters*, Apr. 9, 2001, pp. 2214-2216, vol. 78, No. 15.

Gudiksen, M.S., et al., "Diameter-selective synthesis of semiconductor nanowires", *J. Am. Chem. Soc.*, Aug. 22, 2000, pp. 8801-8802, vol. 122.

Gudiksen, M.S., et al., "Size-Dependent Photoluminescence from Single Indium Phosphide Nanowires", *Journal of Physical Chemistry B*, Mar. 30, 2002, pp. 4036-4039, vol. 106, No. 16.

Duan, X., et al., "Laser-Assisted Catalytic Growth of Single Crystal GaN Nanowires", *Journal of Amer. Chem. Soc.*, Dec. 18, 1999, pp. 188-189, vol. 122, No. 1.

Huang, Y., et al., "Gallium Nitride Nanowire Nanodevices", *Nano Letters*, Jan. 11, 2002, pp. 81-82, vol. 2, No. 2.

Lieber, C., "Nanowire Sugerlattices", *Nano Letters*, Jan. 25, 2002, pp. 82-82, vol. 2, No. 2.

Duan, X., et al., "Nonvolatile Memory and Programmable Logic from Molecule-Gated Nanowires", *Nano Letters*, May 1, 2002, pp. 487-490, vol. 2, No. 5.

Cui, Y., et al., "High Performance Silicon Nanowire Field Effect Transistors", *Nano Letters*, Jan. 1, 2003, pp. 149-152, vol. 3, No. 2.

Zhong, Z., et al., "Synthesis of P-Type Gallium Nitride Nanowires for Electronic and Photonic Nanodevices", *Nano Letters*, Feb. 20, 2003, pp. 343-346, vol. 3, No. 3.

Hu, J., et al., "Controlled Growth and Electrical Properties of Heterojunctions of Carbon Nanotubes and Silicon Nanowires", *Nature*, May 6, 1999, pp. 48-51, vol. 399.

Duan, X., et al., "Indium phosphide nanowires as building blocks for nanoscale electronic and optoelectronic devices", *Nature*, Jan. 4, 2001, pp. 66-69, vol. 409.

Gudiksen, M.S., et al., "Growth of nanawire superlattice structures for nanoscale photonics and electronics", *Nature*, Feb. 7, 2002, pp. 617-620, vol. 415.

Lauhon, L., et al., "Epitaxial Core-Shell and Core-Multishell Nanowire Heterostructures", *Nature*, Nov. 7, 2002, pp. 57-61, vol. 420, No. 6911.

Duan, X., "Single-nanowire electrically driven lasers", *Nature*, Jan. 16, 2003, pp. 241-244, vol. 421.

Lieber, C., "The incredible shrinking circuit", *Sci. Am.*, Sep. 1, 2001, pp. 58-64, vol. 285.

Morales, A., et al., "A Laser Ablation Method for the Synthesis of Crystalline Semiconductor Nanowires", *Science*, Jan. 9, 1998, pp. 208-211, vol. 279.

Cui, Y., et al., "Functional Nanoscale Electronic Devices Assembled Using Silicon Nanowire Building Blocks", *Science*, Feb. 2, 2001, pp. 851-853, vol. 291.

Wang, J., et al., "Highly Polarized Photoluminesence and Photodetection from Single Indium Phosphide Nanowires", *Science*, Aug. 24, 2001, pp. 1455-1457, vol. 293, No. 5534.

Cui, Y., et al., "Nanowire nanosensors for highly sensitive and selective detection of biological and chemical species", *Science*, Aug. 17, 2001, pp. 1289-1292, vol. 293.

Huang, Y., et al., "Logic Gates and Computation from Assembled Nanowire Building Blocks", *Science*, Nov. 9, 2001, pp. 1313-1317, vol. 294.

Cui, Y., et al., "Doping and Electrical Transport in Silicon Nanowires", *The Journal of Physical Chemistry B*, May 11, 2000, pp. 5213-5216, vol. 104, No. 22.

Gudiksen, M.S., et al., "Synthetic Control of the Diameter and Length of Single Crystal Semiconductor Nanowires", *The Journal of Physical Chemistry B*, Apr. 18, 2001, pp. 4062-4064, vol. 105.

Morales, A., et al., "Rational Synthesis of Silicon Nanowires", *INOR*, 651, Jan. 1, 2001.

Wong, E., et al., "Nanobeam Mechanics: Elasticity, Strength, and Toughness of Nanorods and Nanotubes", *Science*, Sep. 26, 1997, pp. 1971-1975, vol. 277.

Dai, H., et al., "Synthesis and Characterization of Carbide Nanorods", *Nature*, Jun. 29, 1995, pp. 769-772, vol. 375.

Junno, T., et al., "Controlled manipulation of nanogarticles with an atomic force microscope", *Applied Physics Letters*, Jun. 26, 1995, pp. 3627-3629, vol. 66.

Zwiller, V., et al., "Single quantum dots emit single photons at a time: Antibunching experiment", *Applied Physics Letters*, Apr. 23, 2001, pp. 2476-2478, vol. 78, No. 17.

Borgstrom, M., et al., "High peak-to-valley ratios observed in InAs/InP resonant tunneling quantum dot stacks", *Applied Physics Letters*, May 21, 2001, pp. 3232-3234, vol. 78, No. 21.

(56) References Cited

OTHER PUBLICATIONS

Thelander, et al., "Gold manoparticle single-electron transistor with carbon nanotube leads", *Applied Physics Letters*, Sep. 24, 2001, pp. 2106-2108, vol. 79, No. 13.
Ohlsson, B.J., et al., "Size-, shape-, and position-controlled GaAs nono-whiskers", *Applied Physics Letters*, Nov. 12, 2001, pp. 3335-3337, vol. 79, No. 20.
Bjork, M.T., et al., :One-dimensional heterostructures in semiconductor nanowhiskers, *Applied Physics Letters*, Feb. 11, 2002, pp. 1058-1060, vol. 80, No. 6.
Persson, M.P. et al., "Electronic Structure of Nanometer-Scale GaAs Whiskers", *Applied Physics Letters*, Aug. 12, 2002, pp. 1309-1311, vol. 81, No. 7.
Thelander, C., et al., "Single-Electron Transistors in Heterostructure Nanowires", *Applied Physics Letters*, Sep. 8, 2003, pp. 2052-2054, vol. 83, No. 10.
Panev, N., et al., "Sharp Exciton Emission From Single InAs Quantum Dots in GaAs Nanowires", *Applied Physics Letters*, Sep. 15, 2003, pp. 2238-2240, vol. 83, No. 11.
Bjork, M.T., "Nanowire resonant tunelling diodes", *Applied Physics Letters*, Dec. 2, 2002, pp. 4458-4460, vol. 81, No. 23.
Persson, A., "Oriented Growth of InAs-based Nanowhiskers", *Diploma Work, Lund Institute of Technology, Lund University*, May 29, 2001, pp. 1-48.
Ohlsson, J., "Semiconductor Hetero- and Nanostructures", *Doctoral Thesis, Lund Institute of Technology, Lund University*, Nov. 23, 2001.
Thelander, C., "Quantum Devices from the Assembly of Zero-and One-Dimensional Building Blocks", *Doctoral Thesis, Lund University*, Nov. 7, 2003.
Ohlsson, B., et al., "Anisotropic GaAs island phase grown on flat Gap: A stranski-Krastanow-formed corrugated surface", *Journal of Applied Physics*, May 15, 2001, pp. 5726-5730, vol. 89, No. 10.
Magnusson, M., et al., "Gold nanogarticles: Production, reshaping, and thermal charging", *Journal of Nanoparticle Research*, Jan. 1, 1999, pp. 243-251, vol. 1.
Samuelson, L., "Self-Forming Nanoscale Devices", *Materials Today*, Oct. 22, 2003, pp. 22-31.
Ohlsson, B., et al., "Fabrication and characterization of III-V nanowhiskers",*MSS10 Conference—Austria*, Jul. 23-27, 2001.
Bjork, M.T., et al., "One-dimensional Steeplechase for Electrons Realized", *Nano Letters*, Jan. 19, 2002, pp. 87-89, vol. 2, No. 2.
Martensson, T., et al., "Fabrication of Individually Seeded Nanowire Arrays by Vapour-Liquid-Solid Growth", *Nanotechnology*, Oct. 17, 2003, pp. 1255-1258, No. 14.
Burgess, D.S., "Nanowire Heterostructures Form Tunneling Diodes", *Photonics Spectra*, pp. 3-5, vol. 37, No. 2.
Pettersson, H., et al., "Electrical and Optical Properties of Self-Assembled InAs Quantum Dots in InP Studied by Space-Charge Spectroscopy and Photoluminescence", *Phys. Rev. B*, Feb. 15, 2000, pp. 4795-4800, vol. 61, No. 7.
Ohlsson, B.J., et al., "Growth and characterization of GaAs and InAs nano-whiskers and InAs/GaAs heterostructures", *Physica E*, Mar. 1, 2002, pp. 1126-1130, No. 13.
Samuelson, L., et al., "Tunnel-Induced Photon Emission in Semiconductors Using an STM", *Physica Scripta*, Jan. 1, 1992, pp. 149-152, vol. T42.
Seifert, W. et al, "In-Situ Growth of Quantum Dot Structures by the Stranski-Krastanow Growth Mode", *Prog. Crys. Growth Charact.*, Jan. 1, 1996, pp. 423-471, vol. 33.
Persson, M., "Tight-Binding Simulation of Nanocrystalline Particles and Whiskers", University, Aug. 1, 2002. *Tekn lic thesis, Lund University*, Aug. 1, 2002.
Bjork, M., "Semiconductor Nanowires and Devices", *Tekn lic thesis, Lund University*, Nov. 1, 2002.
Murphy, C.J., et al., "Controlling the Aspect Ratio of Inorganic Nanorods and Nanawires", *Advanced Materials*, Jan. 4, 2002, pp. 80-82, vol. 14, No. 1.

Wagner, R.S., et al., "Vapour-Liquid-Solid Mechanism of Single Crystal Growth", *Applied Physics Letters*, Mar. 1, 1964, pp. 89-90, vol. 4, No. 5.
Canham, L.T., "Silicon Quantum Wire Array Fabrication by Electrochemical and Chemical Dissolution of Wafers", *Applied Physics Letters*, Sep. 3, 1990, pp. 1046-1048, vol. 57.
Koga, T., et al., "Carrier Pocket Engineering Applied to Strained . . .", *Applied Physics Letters*, Oct. 18, 1999, pp. 2438-2440, vol. 75.
Koga, T., et al., "Experimental Proof-of-Principle Investigation of Enhanced $Z_{3d}T$ in (001) Oriented Si/Ge Superlattices", *Applied Physics Letters*, Sep. 4, 2000, pp. 1490-1492, vol. 77, No. 10.
Narihiro, M., et al., "Resonant tunneling of electrons via 20 nm scale InAs quantum dot and magnetotunneling spectroscopy of its electronic states", *Applied Physics Letters*, Jan. 6, 1997, pp. 105-107, vol. 70, No. 1.
Pan, Z., et al., "Conduction band offset and electron effective mass in GaInNAs/GaAs quantum-well structures with low nitrogen concentration", *Applied Physics Letters*, Apr. 9, 2001, pp. 2217-2219, vol. 78, No. 15.
Ferry, D.K., et al., "Transport in Nanostructures", *Cambridge University Press*, Hardcover, Jan. 1, 1997, pp. 41-45 and 91-96.
Givargizov, E., "Growth of Whiskers by the Vapor-Liquid-Solid Mechanism", *Current Tonics in Material Science*, edited by E. Kaldis, Jan. 1, 1978, pp. 79-145, Chapter 3, vol. 1.
Mullins, J., "News analysis: using unusable frequencies", *IEEE Spectrum*, Jul. 1, 2002, pp. 22-23, vol. 39, No. 7.
Randall, J.N., et al., "Quantum Dot Devices", in Norman G. Einsgruch and William R. Frensley, eds., Heterostructures and Quantum Devices (San Diego, CA: Academic Pres, Inc., 1994) Copyright 1994, p. 420.
Markowitz, P.D., et al., "Phase Separation in $Al_xGa_{1-x}As$ Nanowhiskers Grown by the Solution-Liquid-Solid Mechanism", *J. Am. Chem. Soc.*, Apr. 18, 2001, pp. 4502-4511, vol. 123.
Hickmott, T.W., et al., "Negative Charge, Barrier Heights, and the Conduction-Ban Discontinuity in $Al_xGa_{1-x}As$ Capacitors", *Journal of Applied Physics*, Apr. 15, 1985, pp. 2844-2853, vol. 57.
Matthews, J., et al., "Defects in Epitaxial Multillayers", *Journal of Crystal Growth*, Jan. 1, 1974, pp. 118-125, vol. 27.
Kovtyukhova, N., et al., "Layer-by-Layer Assembly Rectifying Junctions in and on Metal Nanowires", *Journal of Physical Chemistry B*, Aug. 14, 2001, pp. 8762-8769, vol. 105.
Sakaki, H., "Scattering Suppression and High-Mobility Effect of Size-Quantized Electrons in Ultrafine Semiconductor Wire Structures", *Japanese Journal of Applied Physics*, Dec. 1, 1980, pp. L735-L738, vol. 19, No. 12.
Scheibel, H., et al., "Generation of Monodisperse Ag- and NaCl Aerosols With Particle Diameters Between 2 and 300 nm", *Journal of Aerosol Science, Jan. 1, 1983*, pp. 113-126, vol. 14, No. 2.
Knutson, E., et al., "Aerosol Classification by Electric Mobility: Apparatus, Theory, and Applications", *Journal of Aerosol Science*, Jan. 1, 1975, pp. 443-451, vol. 6.
Miller, M., et al., "Serpentine Superlattice: Concept and First Results", *Journal of Crystal Growth*, Jan. 1, 1991, pp. 323-327, vol. 111.
Brat, R., et al., "Patterned Quantum Well Heterostructures Grown by OMCVD on Non-Planar Substrates: Applications to Extremely SQW Lasers", *Journal of Crystal Growth*, Jan. 1, 1988, pp. 850-856, vol. 93.
Hara, S., et al, "Formation and Photoldnescence Characterization of Quantum Well Wires Using Multiatdc Steps Grown by Metalorganic Vapor Phase Epitaxy", *Journal of Crystal Growth*, Jan. 1, 1994, pp. 692-697, vol. 145.
Givargizov, E.I., "Fundamental Aspects of VLS Growth", *Journal of Crystal Growth*, Jan. 1, 1975, pp. 20-30, vol. 31.
Derycke, V., et al., "Carbon Nonotube Inter- and Intramolecular Logic Gates", *Nano Letters*, Aug. 26, 2001, pp. 453-456, vol. 1, No. 9.
Iijima, S., "Helical microtubules of graphitic carbon", *Nature*, Nov. 7, 1991, pp. 56-58, vol. 354.
Yao, Z., et al., "Carbon Nanotube Intramolecular Junctions", *Nature*, Nov. 18, 1999, pp. 273-276, vol. 402.

(56) References Cited

OTHER PUBLICATIONS

Bennett, C., et al., "Quantum information and computation", *Nature*, Nov. 18, 1999, Mar. 16, 2000, pp. 247-255, vol. 404.

Michler, P. et al., "Quantum correlation among photons from a single quantum dot at room temperature", *Nature*, Aug. 31, 2000, pp. 968-970, vol. 406, No. 6799.

Chow, E., et al., "Three-dimensional control of light in a two-dimensional photonic crystal slab", *Nature*, Oct. 26, 2000, pp. 983-986, vol. 407.

Venkatasubramanian, R., et al., "Thin-Film Thermoelectric Devices with High Room-Temperature Figures of Merit", *Nature*, Oct. 11, 2003, pp. 597-602, vol. 413.

Bachtold, A., et al., "Scanned probe microscopy of electronic transport in carbon nanotubes", *Phys. Rev. Lett.*, Jun. 26, 2000, pp. 6082-6085, vol. 84, No. 26.

Hicks, L.D., et al., "Thermoelectric Figure of Merit of a One-Dimensional Conductor", *Physical Review B*, Jun. 15, 1993, pp. 16631-16634, vol. 47, No. 24.

Itskevich, I.E., et al., "Resonant magnetotunneling through individual self-assembled InAs quantum dots", *Physical Review B*, Dec. 15, 1996, pp. 16401-16404, vol. 54, No. 23.

Reed, M.A., et al., "Observation of Discrete Electronic States in a Zero-Dimensional Semiconductor Nanostructure", *Physical Review Letters*, Feb. 8, 1988, pp. 535-537, vol. 60, No. 6.

Kapon, E., et al., "Stimulated Emission in Semiconductor Quantum Wire Heterostructures" *Physical Review Letters*, Jul. 24, 1989, pp. 430-433, vol. 63, No. 4.

Santori, C., et al., "Triggered Single Photons from a Quantum Dot", *Physical Review Letters*, Feb. 19, 2001, pp. 1502-1505, vol. 86, No. 8.

Capasso, F., et al., "Quantum Cascade Lasers", *Physics Today*, May 1, 2002, pp. 34-40.

Likharev, K.K., "Single-Electron Devices and their Applications", *Proceedings of the IEEE*, Apr. 1, 1999, pp. 606-632, vol. 87, No. 4.

Han, W., et al., "Synthesis of Gallium Nitride Nanorods Throuah a Carbon Nanotube-Confined Reaction", *Science*, Aug. 29, 1997, pp. 1287-1289, vol. 277.

Zhang, Y., et al., "Heterostructures of Single-Walled Carbon Nanotubes and Carbide Nanorods", *Science*, Sep. 10, 1999, pp. 1719-1722, vol. 285.

Holmes, J., et al., "Control of Thickness and Orientation of Solution-Grown Silicon Nanowires", *Science*, Feb. 25, 2000, pp. 1471-1473, vol. 287.

Zhou, C.W., et al., "Modulated chemical doping of individual carbon nanotubes", *Science*, Nov. 24, 2000, pp. 1552-1555, vol. 290.

Favier, F., et al., "Hydrogen Sensors and Switches from Electrodeposited Palladium Mesowire Arrays", *Science*, Sep. 21, 2001, pp. 2227-2231, vol. 293.

Bachtold, A., et al., "Logic circuits with carbon nanotube transistors", *Science*, Nov. 9, 2001, pp. 1317-1320, vol. 294.

Nicewarner-Pena, S.R., et al., "Submicrometer metallic barcodes", *Science*, Oct. 5, 2001, pp. 137-141, vol. 294.

Service, R.F., "Nanowire Fabricators Earn Their Stripes", *Science*, Jan. 1, 2002, pp. 946-947, vol. 295, No. 5557.

Awschalom, D.D. et al., "Spintronics", *Scientific American*, Jun. 1, 2002, pp. 66-73, vol. 286, No. 6.

Henning, P., et al., "Compositional information from amorphous Si—Ge multilayers using high-resolution electron microscopy imaging and direct digital recording", *Ultramicroscopy*, Jan. 1, 1996, pp. 221-235, vol. 66.

Wagner, R.S., "VLS Mechanism of Crystal Growth", *Whisker Technology, A.P. Levitt, ed.*, Chapter 3, Jan. 1, 1970, pp. 47-119.

Alferov, Z., et al., "For developing semiconductor heterostructures used in high-speed-and opto-electronics", Nov. 23, 2000, www.nobel.se.physics/laureates/2000/.

Von Klitzing, K., "For the discovery of the quantized Hall effect", Jun. 16, 2000, www.nobel.se/physics/laureates/1985/.

Laughlin, R.B., et al., "For their discovery of a new form of quantum fluid with frictionally charged excitations", Jun. 16, 2000, www.nobel.se/physics/laureates/1998/.

Oda, Y., et al., "Natural Formation of Square Scale Structures on Patterned Vicinal Substrates by MOVPE: Application to the Fabrication of Quantum Structures", *Phys. Conf. Ser.*, No. 166, Chapter 4, Aug. 22-26, 1999, pp. 191-194.

Hayakawa, K., et al., "AlGaAs Nano-Meter Scale Network Structures Fabricated by Selective Area MOVPE", *Phys. Conf. Ser.*, No. 162, Chapter 8, Oct. 12-16, 1998.

Akabori, M., et al., "Selective Area MOVPE Growth of Two-Dimensional Photonic Crystals Having an Air-Hole Array and its Application to Air-Bridge-Type structure" *Physica E*, No. 13, Jan. 1, 2002, pp. 446-450.

Melechko, A.V., et al., "Large-Scale Synthesis of Arrays of High-Aspect-Ratio Rigid Vertically Aligned Carbon Nanofibres", *Nanotechnology*, No. 14, Aug. 19, 2003, pp. 1029-1035.

Kempa, K., et al., "Photonic Crystals Based on Periodic Arrays of Aligned Carbon Nanotubes", *Nano Letters*, Nov. 19, 2002, pp. 13-18, vol. 3, No. 1.

Takahashi, H., et al., "Formation and Characteristics of 100 nm Scale GaAs Quantum Wires by Selective Area MOVPE", *Applied Surface Science*, No. 216, Jan. 1, 2003, pp. 402-406.

Akabori, M., et al., "InGaAs Nano-Pillar Array Formation on Partially Masked InP(111)B by Selective Area Metal-Organic Vapour Phase Egitaxial Growth for Two-Dimensional Photonic Crystal Application", *Nanotechnology*, No. 14, Aug. 27, 2003, pp. 1071-1074.

Kamins, T.I., et al., "Self-Assembled Silicon Nanowires for Integrating Microsystems, Nanoelectronics and Microelectronics", *mstnews*, Mar. 2003, Mar. 1, 2003.

Wu, Y., et al., "Rational Synthesis of Inorganic Nanowires" *Abstracts of Papers in the Amer. Chem. Soc.*, Apr. 1, 2001, pp. 108—Iec Part 1, vol. 221.

Yang, P., et al., "Nanowires from Vapor Condensation and their Assemblies", *Abstracts of Papers in the Amer. Chem. Soc.*, Mar. 26, 2000, pp. 269—Inor Part 1, vol. 219.

Huang, M., et al., "Nanowire Array as Potential 2-d Photonic Bandgap Materials", *Abstracts of Paners in the Amer. Chem. Soc.*, Apr. 1, 2001, pp. 95—Phys Part 2, vol. 221.

Yang, P., et al., "Inorganic Nanowires: Rational Synthesis, Functional Assemblies and Novel Properties", *Abstracts of Papers in the Amer. Chem. Soc.*, Apr. 7, 2002, pp. 343—Inor Part 2, vol. 223.

Gates, B., et al., "Synthesis and Characterization of Crystalline Ag2Se Nanowires through a Template-Engaged Reaction at Room Temperature", *Advanced Fun. Materials*, Oct. 1, 2002, pp. 679-686, vol. 12, No. 10.

Yang, P., et al., "Controlled Growth of ZnO Nanowires and their Optical Properties", *Advanced Functional Materials*, May 2002, pp. 323-331, vol. 12, No. 5.

Wu, Y., et al., "Superconducting MgB2 Nanowires", *Advanced Materials*, Oct. 2, 2001, pp. 1487-1489, vol. 13, No. 19.

Huang, M., et al., "Catalytic Growth of Zinc Oxide Nanowires by Vapor Transport", *Advanced Materials*, Jan. 16, 2001, pp. 113-116, vol. 13, No. 2.

Wu, Y., et al., "Melting and Welding Semiconductor Nanowires in Nanotubes", *Advanced Materials*, Apr. 4, 2001, pp. 520-523, vol. 13, No. 7.

Zheng, B., et al., "Synthesis of Ultra-Long and Highly Oriented Silicon Oxide Nanowires from Liquid Alloys", *Advanced Materials*, Jan. 16, 2002, pp. 122-124, vol. 14, No. 2.

Kind, H., et al., "Nanowire Ultraviolet Photodetectors and Optical Switches", *Advanced Materials*, Jan. 16, 2002, pp. 158-160, vol. 14, No. 2.

Xia, Y., et al., "Chemistry and Physics of Nanowires", *Advanced Materials*, Mar. 4, 2003, pp. 351-352, vol. 15, No. 5.

Xia, Y., et al., "One-Dimensional Nanostructures: Synthesis, Characterization, and Applications", *Advanced Materials*, Mar. 4, 2003, pp. 353-389, vol. 15, No. 5.

Yan, H., et al., Morphogensis of One-Dimensional ZnO Nano- and Microcrystalsm, *Advanced Materials*, Mar. 4, 2003, pp. 402-405, vol. 15, No. 5.

(56) References Cited

OTHER PUBLICATIONS

Wu, Y., et al., "Germanium/Carbon Core-Sheath Nanostructures", *Applied Physics Letters*, Jul. 3, 2000, pp. 43-45, vol. 77, No. 1.

Wu, Y., et al., "Inorganic Semiconductor Nanowires: Rational Growth, Assembly, and Novel Properties", *Chemistry—A European Journal*, Mar. 15, 2002, pp. 1261-1268, vol. 8, No. 6.

Yang, P., et al., "Langmuir-Blodgett Assembly of One-Dimensional Nanostructures", *Chemphyschem*, Jun. 17, 2002, pp. 503-506, vol. 3, No. 6.

Wu, Y., et al., "Direct Observation of Vapor-Liquid-Solid Nanowire Growth", *J. Am. Chem. Soc.*, Mar. 13, 2001, pp. 3165-3166, vol. 123.

Yan, H., et al., "Dendritic Nanowire Ultraviolet Laser Array", *J. Am. Chem. Soc.*, Mar. 29, 2003, pp. 4728-4729, vol. 125, No. 16.

Johnson, J., et al., "Single Nanowire Lasers", *Journal of Physical Chemistry B*, Oct. 23, 2001, pp. 11387-11390, vol. 105, No. 46.

Messer, B., et al., "Microchannel Networks for Nanowire Patterning", *Journal of the Amer. Chem. Soc.*, Sep. 29, 2000, pp. 10232-10233, vol. 122, No. 41.

Song, J., et al., "$MMo_3$ $Se_3$ (M=Li+,Na+, Rb+,Cs+, NMe4+) Nanowire Formation via Cation Exchange in Organic Solution", *Journal of the Amer. Chem. Soc.*, Mar. 10, 2001, pp. 9714-9715, vol. 123, No. 39.

Li, Y., et al, "Bismuth Nanotubes: A Rational Low-Temperature Synthetic Route", Journal of the Amer. Chem. Soc., Sep. 14, 2001, pp. 9904-9905, vol. 123, No. 40.

Song, J., et al., "Metal Nanowire Formation Using $Mo_3Se_3$—as Reducing and Sacrificing Templates", *Journal of the Amer. Chem. Soc.*, Sep. 26, 2001, pp. 10397-10398, vol. 123, No. 42.

Gates, B., et al., "Single-Crystalline Nanowires of Ag2Se Can Be Synthesized by Templating Against Nanowires of Trigonal Se", *Journal of the Amer. Chem. Soc.*, Oct. 25, 2001, pp. 11500-11501, vol. 123, No. 46.

Wu, Y., et al., "Block-by-Block Growth of Single-Crystalline Si/SiGe Superlattice Nanowires", *Nano Letters*, Jan. 19, 2002, pp. 83-86, vol. 2, No. 2.

Johnson, J., et al., "Near-Field Imaging of Nonlinear Optical Mixing in Single Zinc Oxide Nanowires", *Nano Letters*, Apr. 1, 2002, pp. 279-283, vol. 2, No. 4.

Johnson, J., et al., "Single Gallium Nitride Nanowire Lasers", *Nature Materials*, Sep. 15, 2002, pp. 106-110, vol. 1, No. 2.

Huang, M.H., et al., "Room-Temperature Ultraviolet Nanowire Nanolasers", *Science*, Jun. 8, 2001, pp. 1897-1899.

Wu, Y., et al., "Germanium Nanowire Growth via Sample Vapor Transport", *Chem. Mater*, Mar. 20, 2000, pp. 605-607, vol. 12.

Wu, Y., et al., "Semiconductor Nanowire Array: Potential Substrates for Photocatalysis and Photovoltaics", *Topics in Catalysis*, Apr. 1, 2002, pp. 197-202, vol. 19, No. 2.

Hiruma, K., et al., "GaAs free-standing quantum-size wires", *Journal of Applied Physics*, Sep. 1, 1993, pp. 3162-3171, vol. 74.

Liu, J.L., et al., "Gas-source MBE growth of freestanding Si nanowires on Au/S1 substrate", *Superlattices Microstructures*, 1999, pp. 477-479, vol. 25, No. 1-2.

Shimada, et al., "Size, position and direction control on GaAs and InAs nanowhisker growth", *Superlattices and Microstructures*, Dec. 1998, pp. 453-458, vol. 24, No. 6.

Shirai, M., et al., "Gold cluster formation using an atomic force microscope and its applications to GaAs whisker growth", *Superlattices and Microstructures*, Aug. 1998, pp. 157-162, vol. 24, No. 2.

Hiruma, K., et al., "Gas and InAs Nanowire Growth Technology", *Proceedings of the Science and Technology of Atomically Engineered Materials*, Oct. 30, 1995, pp. 563-570.

Westwater, J., et al., "Control of the size and position of silicon nanowires grown via the vapor-liquid-solid technique", *Japanese Journal of Applied Physics*, Part 1, Oct. 1997, pp. 6204-6209, vol. 36.

O'Regan, et al., "A Low-Cost, High-Efficiency Solar Cell Based on Dye-Sensitized Colloidal TiOa Films", *Nature*, Oct. 24, 1991, pp. 737-740, vol. 353.

Jun, et al., "Architectural Control of Magnetic Semiconductor Nanocrystals", *J. Am. Checm Soc.*, Jan. 4, 2002, pp. 615-619, vol. 124, No. 4.

Manna, et al., "Synthesis of Soluble and Processable Rod-, Arrow-, Teardrop-, and Tetrapod-Shaped CdSe Nanocrystals", *J. Am. Chec. Soc.*, Dec. 1, 2000, pp. 12700-12706, vol. 122, No. 51.

Huang, et al., "Directed Assembly of one-dimensional nanostructures into functional networks", *Science*, Jan. 26, 2001, pp. 630-633, vol. 291.

Persson, "Heterointerfaces in III-V semiconductor nanowhiskers", *IEEE*, 2002, pp. 281-283.

Gao, et al., "Self-Assembled Nanowire-Nanoribbon Junction Arrays of ZnO", *The Journal of Physical Chemistry*, Nov. 12, 2002, pp. 12653-12658, vol. 106, No. 49.

Jun, et al., "Controlled Synthesis of Multi-Armed CdS Nanorod Architectures Using Monosurfactant System", *J. Am. Chem. Soc.*, May 5, 2001, pp. 5150-5151, vol. 123.

Poole, et al., "Spatially Controlled, Nanoparticle-Free Growth of InP Nanowires", *Applied Physics Letters*, Sep. 8, 2002, pp. 2055-2057, vol. 83, No. 10.

Hiruma et al., "Quantum Size Microcrystals Grown Using Organametallic Vapor Phase Epitaxy", *Appl. Phys. Lett.*, vol. 59, No. 4, Jul. 22, 1991, pp. 431-433.

Ozaki et al., "Silicon Nanowhiskers Grown on a Hydrogen-Terminated Silicon (111) Surface", *Applied Physics Letters*, vol. 73, No. 25, Dec. 21, 1998, pp. 3700-3702.

Wu et al., "Growth, Branching, and Kinking of Molecular-Beam Epitaxial <110> GaAs Nanowires", *Applied Physics Letters*, vol. 83, No. 16, Oct. 20, 2003, pp. 3368-3370.

Grätzel, "Photoelectrochemical Cells", *Nature*, vol. 414, Nov. 15, 2001, pp. 338-344.

Wang et al., "Nanocrystals Branch Out", *Nature Materials*, vol. 2, Jun. 2003, pp. 385-386.

Manna et al., "Controlled Growth of Tetrapod-Branched Inorganic Nanocrystals", *Nature Materials*, vol. 2, Jun. 2003, pp. 382-385.

Oda et al., "Natural Formation of Square Scale Structures on Patterned Vicinal Substrates by MOVPE: Application to the Fabrication of Quantum Structures", *Inst. Phys. Conf. Ser.*, No. 166, Chapter 4, Aug. 22, 1999, pp. 191-194.

Akabori et al., "Selective Area MOVPE Growth of Two-Dimensional Photonic Crystals Having an Air-Hole Array and its Application to Air-Bridge-Type Structures", *Physica E*, No. 13, 2002, pp. 446-450.

McAlpine et al., "Nanoimprint Lithography for Hybrid Plastic Electronics", *Nano Letters*, vol. 3, No. 4, Mar. 7, 2003, pp. 443-445.

Bozovic et al., "Plastic Deformation in Mechanicaly Strained Single-Walled Carbon Nanotubes", *Physical Review B*, vol. 57, Jan. 22, 2003, pp. 033407-1-033407-4.

Lieber, "Nanoscale Science and Technology: Building a Big Future from Small Things", MRS Bulletin, Jul. 2003, pp. 486-491.

Yu et al., "Silicon Nanowires: Preparation, Device Fabrication, and Transport Properties", *J. Phys. Chem. B.*, vol. 104, No. 50, Nov. 23, 2000, pp. 11864-11870.

Law et al., "Photochemical Sensing of $NO_2$ with $SnO_2$ Nanoribbon Nanosensors at Room Temperature", *Angew. Chem. Int. Ed.*, vol. 41, No. 13, 2002, pp. 2405-2408.

Lao et al., "Hierarchical ZnO Nanostructures", *Nano Letters*, vol. 2, Sep. 13, 2002, pp. 1287-1291.

Barrelet et al., "Synthesis of CdS and ZnS Nanowires Using Single-Source Molecular Precursors", *J. Am. Chem. Soc.*, vol. 125, 2003, pp. 11498-11499.

Hornstra, "Dislocations in the Diamond Lattice", *J. Phys. Checm. Solids*, vol. 5, 1958, pp. 129-141.

Krost et al., "InP on Si(111): Accommodation of Lattice Mismatch and Structural Properties", *Appl. Phys. Lett.*, vol. 64, No. 7, Feb. 7, 1994, pp. 769-771.

Gorbach et al., "Growth of III-V Semiconductor Layers on Si Patterned Substrates", *Thin Solid Films*, vol. 336, 1998, pp. 63-68.

Ohlsson et al., "Anti-Domain-Free GaP, Grown in Atomicaly Flat (001) Si Sub-μm-sized Openings", *Applied Physics Letters*, vol. 80, No. 24, Jun. 17, 2002, pp. 4546-4548.

Kawanami, "Heteroepitaxial Technologies of III-V on Si", *Solar Energy Materials & Solar Cells*, vol. 66, 2001, pp. 479-486.

(56) References Cited

OTHER PUBLICATIONS

Westwater et al., "Growth of Silicon Nanowires via Gold/Silane Vapor-Liquid-Solid Reaction", *J. Vac. Sci. Technol. B.*, vol. 15, No. 3, 1997, pp. 554-557.
Kamins et al., "Ti-Catalyzed Si Nanowjres by Chemical Vapor Deposition: Microscopy and Growth Mechanisms", *Journal of Applied Physics*, vol. 89, No. 2, Jan. 15, 2001, pp. 1008-1016.
Thornton et al., "A Photoemission Study of Passivated Silicon Surfaces Produced by Etching in Solutions of HF", *Semicond. Sci. Technol.*, vol. 4, 1989, pp. 847-851.
Westwater et al., "Si Nanowires Grown via the Vapour-Liquid-Solid Reaction", *Phys. Stat. Sol.*, vol. (a)165, 1998, pp. 37-42.
Westwater et al., "The Characteristics and Oxidation of Vapor-Liquid-Solid Grown Si Nanowires", *Mat. Res. Soc. Symp. Proc.*, vol. 452, 1997, pp. 237-242.
Westwater et al., "Nanoscale Silicon Whiskers Formed by Silane/Gold Reaction at 335° C.", *Materials Letters*, vol. 24, Jun. 1995, pp. 109-112.
Yang, "Semiconductor Nanowire Array", *Proceedings of the SPIE*, vol. 4806, 2002, pp. 222-224.
Abramson et al., "Nanowire Composite Thermoelectric Devices", *Proceedings of IMECE2002, ASME International Mechanical Engineering Congress & Exposition*, Nov. 17-22, 2002, pp. 7-11.
Johnson et al., "Single Nanowire Waveguides and Lasers", *Proceedings of SPIE*, vol. 5223, 2003, pp. 187-196.
Greene et al., "Low-Temperature Wafer-Scale Production of ZnO Nanowire Arrays", *Angew. Chem. Int. Ed.*, vol. 42, 2003, pp. 3031-3034.
Choi et al., "Self-Organized GaN Quantum Wire UV Lasers", *J. Phys. Chem. B.*, vol. 107, 2003, pp. 8721-8725.
Samuelson et al., "Fabrication and Spectroscopic Studies of InP/GaInAs/Inp and GaAs/GaInAs/GaAs Quantum-Well Wire Structures", *Inst. Phys. Confer. Ser.*, No. 127, Chapter 3, Jan. 1, 1992, pp. 95-98.
Samuelson et al., "Fabrication and Imaging of Quantum Well Wire Structures", *SPIE*, vol. 1676, 1992, pp. 154-160.
Ramvall et al., Quantized Conductance in a Heterostructurally Defined $Ga_{0-.25}In_{O-.75}As/InP$, *Appl. Phys. Lett.*, vol. 71, Aug. 18, 1997, pp. 918-920.
Ng et al., "Growth of Epitaxial Nanowires at the Junctions of Nanowalls", *Science*, vol. 300, May 23, 2003, p. 12.
Björk et al., "Heterostructures in One-Dimensional Nanowires", *Proceedings of 7th International Conference of Nanometer-Scale Science and Technology and 21st European Conference on Surface Science*, Jun. 24, 2002.
Ohlsson et al., "Comparison Between (111)B and (100)III-V Nanowhiskers", Proceedings of 7th International Conference of Nanometer-Scale Science and Technology and 2Ist European Conference on Surface Science, Jun. 24, 2002.
Larsson et al, In-Situ Manipulations and Electrical Measurements of III-V Nanowhiskers with TEM-STM, Proceedings of 7th International Conference of Nanometer-Scale Science and Technology and 21st European Conference on Surface Science, Jun. 24, 2002.
Lieber et al., "Nanowires as Building Blocks for Nanoelectronics and Nanophotonics", *Electron Devices Meeting 2003 IEEE International*, 2003, pp. 12.3.1-12.3.3.
Wang et al., "Rational Growth of Branched and Hyperbranched Nanowire Structures", *Nano Letters*, vol. 4, No. 5, Mar. 31, 2004.
Dick et al., "Synthesis of Branched 'Nanotrees' by Controlling Seeding of Multiple Branching Events", *Nature Materials*, vol. 3, May 2, 2004.
Melechko et al., "Large-Scale Synthesis of Arrays of High-Aspect-Ratio Ridig Vertically Aligned Carbon Nanofibres", *Nanotechnology*, No. 14, Aug. 19, 2003, pp. 1029-1035.
Wu et al., "Single-Crystal Metallic Nanowires and Metal/Semiconductor Nanowire Heterostructures", *Nature*, vol. 430, Jul. 1, 2004, pp. 61-65.
Zhong et al., "Nanowire Crossbar Arrays as Address Decoders for Integrated Nanosystems" *Science*, vol. 302, Nov. 21, 2003, pp. 1377-1379.
McAlpine et al., "High-Performance Nanowire Electronics and Photonics on Glass and Plastic Substrates", *Nano Letters*, vol. 3, No. 11, Oct. 14, 2003, pp. 1531-1535.
Greytak et al., "Growth and Transport Properties of Complementary Germanium Nanowire Field-Effect Transistors", *Applied Physics Letters*, vol. 84, No. 21, May 24, 2004, pp. 4176-4178.
Whang et al., "Large-Scale Hierarchical Organization of Nanowire Arrays for Integrated Nanosystems", *Nano Letters*, vol. 3, No. 9, Aug. 5, 2003, pp. 1255-1259.
Hahm et al., "Direct Ultrasensitive Electrical Detection of DNA and DNA Sequence Variations Using Nanowire Nanosensors", *Nano Letters*, vol. 4, No. 1, Dec. 9, 2003, pp. 51-54.
Björk et al., "Few-Electron Quantum Dots in Nanowires", *Nano Letters*, vol. 4, No. 9, Jul. 28, 2004, pp. 1621-1625.
Martensson et al., "Nanowire Arrays Defined by Nanoimprint Lithography", *Nano Letters*, vol. 4, Mar. 17, 2004, pp. 699-702.
Schubert et al., "Silicon Nanowhiskers Grown on <111> Si Substrates by Molecular-Bean Epitaxy", *Applied Physics Letters*, vol. 84, No. 24, Jun. 14, 2004, pp. 4968-4970.
Kamins et al., "Growth and Structure of Chemically Vapor Deposited Ge Nanowires on Si Substrates", *Nano Letters*, vol. 4, No. 3, Jan. 23, 2004, pp. 503-506.
Borgstrom et al., "Size- and Shape-Controlled GaAs Nano-Whiskers Grown by MOVPE: A Growth Study", *Journal of Crystal Growth*, vol. 260, 2004, pp. 18-22.
Kuykendall et al., "Crystallographic Alignment of High-Density Gallium Nitride Nanowire Arrays", *Nature Materials*, vol. 3, Jul. 25, 2004, pp. 524-528.
Abramson et al., "Fabrication and Characterization of a Nanowire/Polymer-Based Nanocomposite for a Prototype Thermoelectric Device", *Journal of Microelectromechanical Systems*, vol. 13, No. 3, Jun. 2004, pp. 505-513.
Kim et al., "Nanowire Arrays for Thermoelectric Devices", *Proceedings of HT2003, ASME Summer Heat Transfer Conference*, Jul. 21-23, 2003, pp. 101-104.
Yang, "From Nanowire Lasers to Quantum Wire Lasers", *Proceedings of SPIE*, vol. 5349, 2004, pp. 18-23.
Mikkelsen et al., "Direct Imaging of the Atomic Structure Inside a Nanowire by Scanning Tunneling Microscopy", *Nature Materials*, vol. 3, Jul. 4, 2004, pp. 519-523.
Thelander et al., "Electron Transport in InAs Nanowires and Heterostructure Nanowire Devices" *Solid State Communications*, vol. 131, Jun. 11, 2004, pp. 573-579.
Samuelson et al., "Semiconductor Nanowires for Novel One-Dimensional Devices", *Physica E*, vol. 21, 2004, pp. 560-567.
Shorubalko et al., "Tunable Nonlinear Current-Voltage Characteristics of Three-Terminal Ballistic Nanojunctions", *Applied Physics Letters*, vol. 83, No. 12, Sep. 22, 2003, pp. 2369-2371.
Larsson et al., "Probing of Individual Semiconductor Nanowhiskers by TEM-STM", *Microscopy and Microanalysis*, vol. 10, 2004, pp. 41-46.
Ng et al., "Epitaxial Single Crystalline Inorganic Nanowires and Nanowalls: Growth Morphogenesis and Applications in Nano-Optoelectronics", *Proceedings of SPIE*, vol. 5349, 2004, pp. 11-17.
Ng et al., "Three Dimensional Columnar Optical Nanostructures Fabricated by Using Lithography-Free Templating Approach", *Applied Physics Letters*, vol. 84, No. 15, Apr. 12, 2004, pp. 2898-2900.
Thelander et al., "One Dimensional Heterostructures and Resonant Tunneling in III-V Nanowires", *IEEE International Symposium on Compound Semiconductors*, Aug. 25, 2003, pp. 151-152.
Persson et al., "Solid-phase-diffusion mechanism for GaAs nanowire growth", *Nature Materials*, vol. 3, Oct. 2004, pp. 677-681.
Ng et al., "Single Crystal Nanowire Vertical Surround-Gate-Field-Effect Transistor", *Nano Letters*, vol. 4, No. 7, May 29, 2004, pp. 1247-1252.
Martensson et al., "Epitaxial-III-V Nanowires on Silicon", *Nano Letters*, vol. 4, No. 10, Sep. 23, 2004, pp. 1987-1990.
Jensen et al., "Role of Surface Diffusion in Chemical Beam Epitaxy of InAs Nanowires", *Nano Letters*, vol. 4, No. 10, Sep. 14, 2004, pp. 1961-1964.
Huynh et al., "Hybrid Nanorod-polyme Solar Cells," Science, vol. 29, pp. 2425-2427, Mar. 29, 2002.

(56) References Cited

OTHER PUBLICATIONS

Baluch et al., "Atomic-level robustness of the Si(100)-2x1: H surface following liquid phase chemical treatments in atmospheric pressure environments," J. Vac. Sci. Technol., A, May/Jun. 2004, 22(3):L1-L5.

Buriak et al., "Organometallic Chemistry on Silicon and Germanium Surfaces," Chemical Reviews, 2002, 102(5):1272-1308.

Endo et al., "Atomic image of hydrogen-terminated Si(001) surfaces after wet cleaning and its first-principles study," J. Appl. Physics, Apr. 1, 2002, 91(7):4065-4072.

Weldon et al., "The surface science of semiconductor processing: gate oxides in the ever-shrinking transistor," Surface science, 2002, 500:859-878.

\* cited by examiner

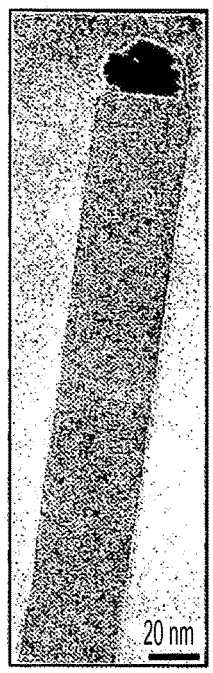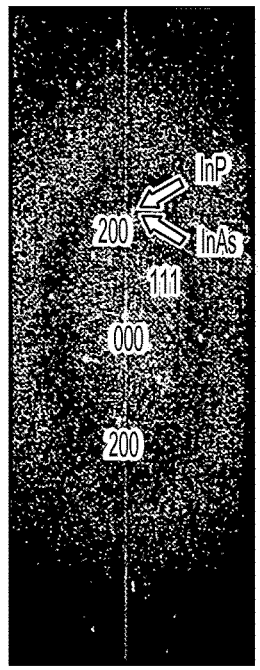
Fig.4(a). Fig.4(b).
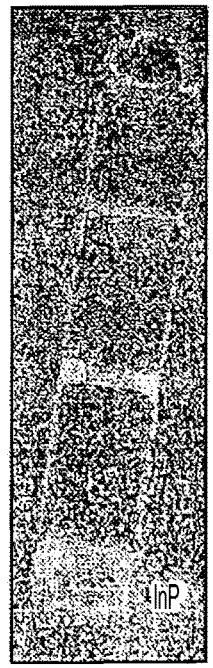
Fig.4(c). Fig.4(d).

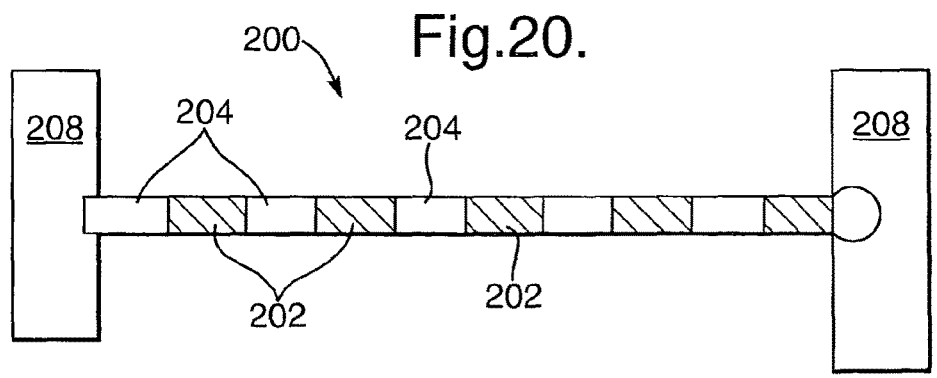
Fig.20.
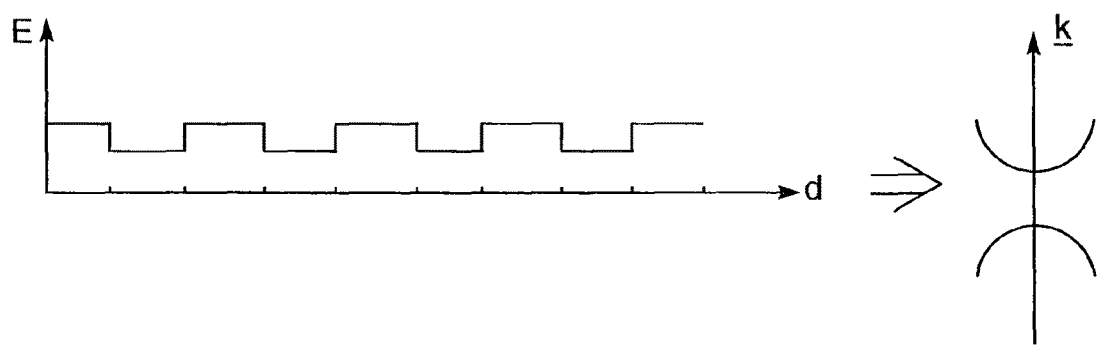
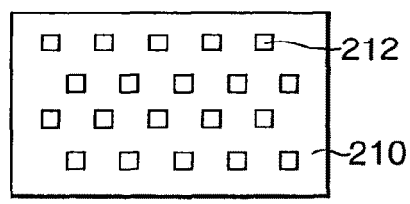
Fig.21(a).
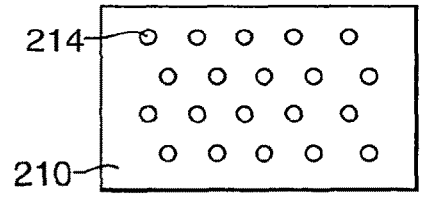
Fig.21(b).
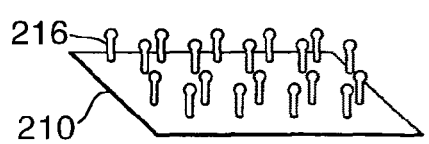
Fig.21(c).
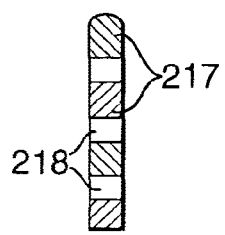
Fig.21(d).

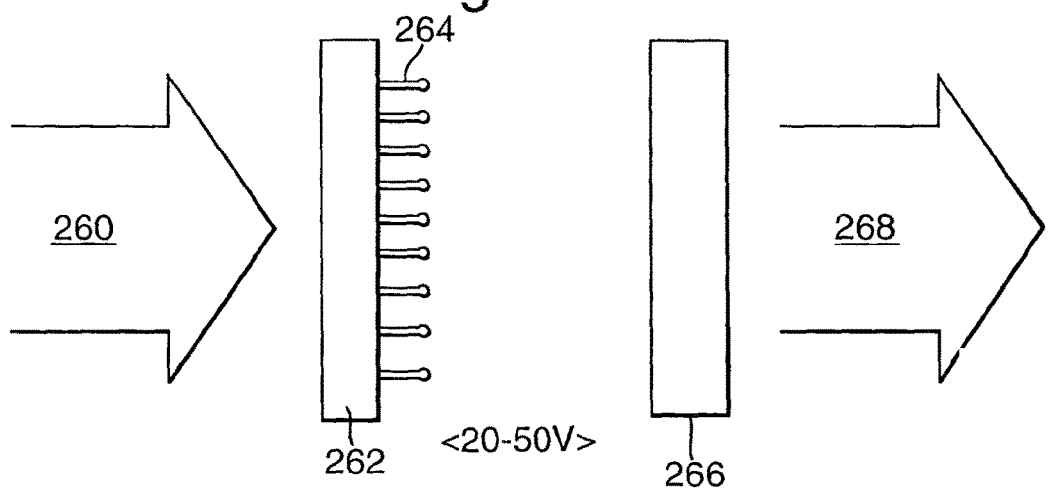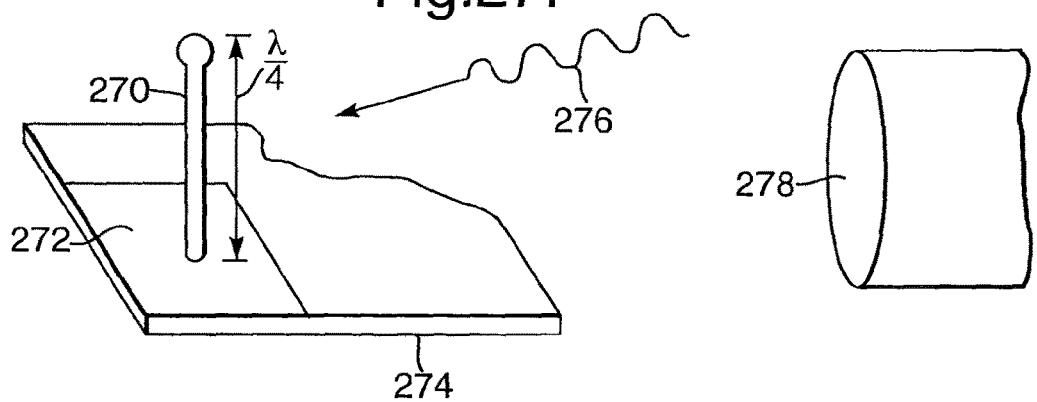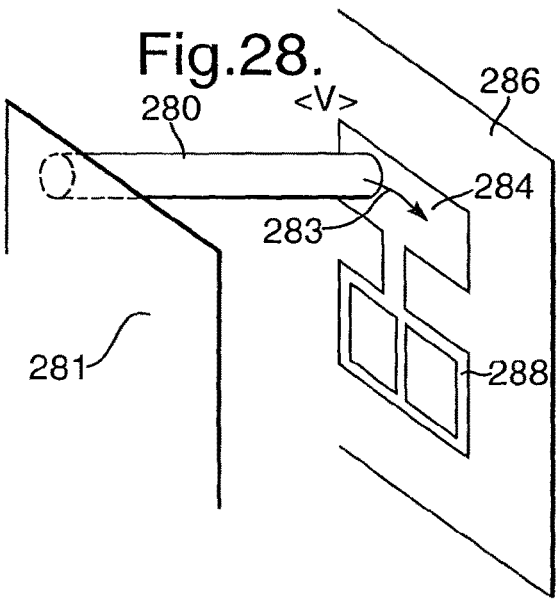

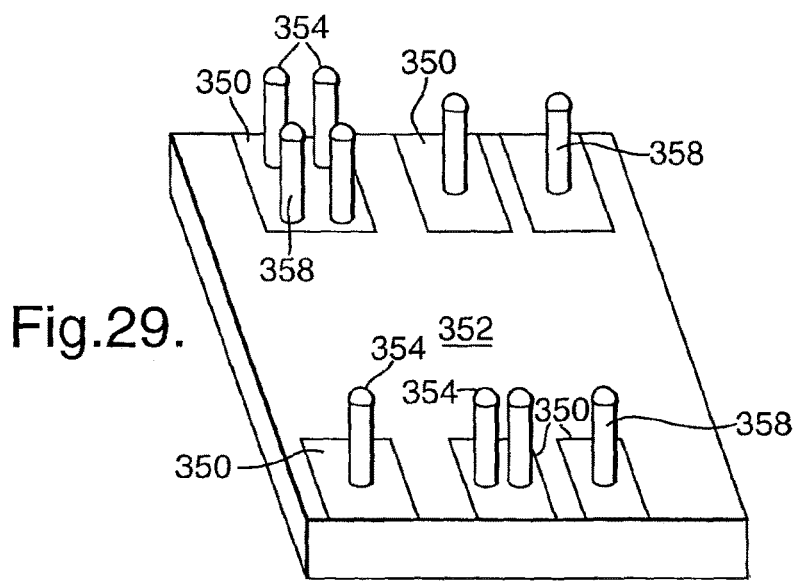
Fig.29.
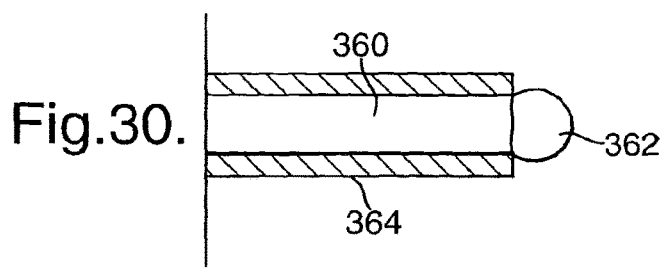
Fig.30.
Fig.31.
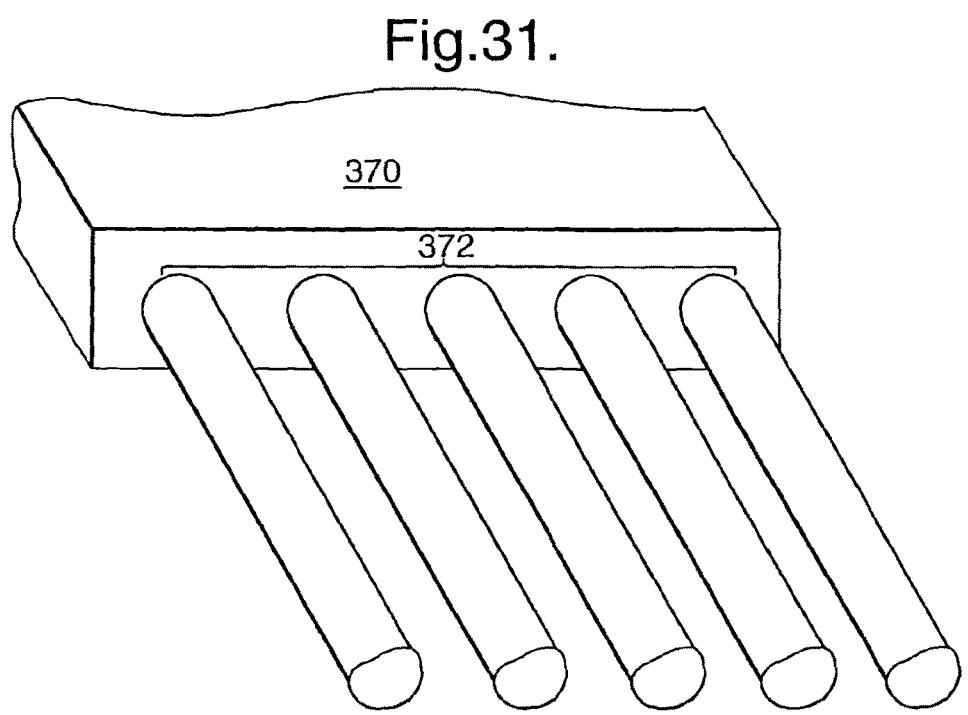

NANOSTRUCTURES AND METHODS FOR MANUFACTURING THE SAME

CROSS-REFERENCE TO RELATED APPLICATIONS

This application is a Continuation of U.S. application Ser. No. 12/003,740, Filed on Dec. 31, 2007, now U.S. Pat. No. 8,772,626, which is a Divisional of U.S. application Ser. No. 10/613,071, filed on Jul. 7, 2003, now U.S. Pat. No. 7,335,908, which claims the benefit of the priority of U.S. Provisional Application No. 60/393,835, filed Jul. 8, 2002, and of U.S. Provisional Application No. 60/459,982, filed on Apr. 4, 2003, each of which is incorporated herein by reference in its entirety.

BACKGROUND OF THE INVENTION

Field of the Invention

This invention relates generally to structures, essentially in one-dimensional form, and which are of nanometer dimensions in their width or diameter, and which are commonly known as nanowhiskers, nanorods, nanowires, nanotubes, etc.; for the purposes of this specification, such structures will be termed "one-dimensional nanoelements". More specifically, but not exclusively, the invention relates to nanowhiskers, and to methods of forming nanowhiskers.

Brief Description of the Prior Art

The basic process of whisker formation on substrates, by the so-called VLS (vapor-liquid-solid) mechanism is well known. A particle of a catalytic material, usually gold, for example, on a substrate is heated in the presence of certain gases to form a melt. A pillar forms under the melt, and the melt rises up on top of the pillar. The result is a whisker of a desired material with the solidised particle melt positioned on top—see "Growth of Whiskers by the Vapour-Liquid-Solid Mechanism"—Givargizov—Current Topics in Materials Science Vol. 1, pages 79-145—North Holland Publishing Company 1978. The dimensions of such whiskers were in the micrometer range.

International Application WO 01/84238 discloses in FIGS. 15 and 16 a method of forming nanowhiskers wherein nanometer sized particles from an aerosol are deposited on a substrate and these particles are used as seeds to create filaments or nanowhiskers. For the purposes of this specification the term nanowhiskers is intended to mean one dimensional nanoelements with a diameter of nanometer dimensions, the element having been formed by the VLS mechanism.

Typically, nanostructures are devices having at least two dimensions less than about 1 µm (i.e., nanometer dimensions). Ordinarily, layered structures or stock materials having one or more layers with a thickness less than 1 µm are not considered to be nanostructures, although nanostructures may be used in the preparation of such layers, as is disclosed below. Thus the term nanostructures includes free-standing or isolated structures having two dimensions less than about 1 µm which have functions and utilities that are different from larger structures and are typically manufactured by methods that are different from conventional procedures for preparing somewhat larger, i.e., microscale, structures. Thus, although the exact boundaries of the class of nanostructures are not defined by a particular numerical size limit, the term has come to signify such a class that is readily recognized by those skilled in the art. In many cases, an upper limit of the size of the dimensions that characterize nanostructures is about 500 nm.

Where the diameter of a nanoelement is below a certain amount, say 50 nm, quantum confinement occurs where electrons can only move in the length direction of the nanoelement; whereas for the diametral plane, the electrons occupy quantum mechanical eigenstates.

The electrical and optical properties of semiconductor nanowhiskers are fundamentally determined by their crystalline structure, shape, and size. In particular, a small variation of the width of the whisker may provoke a considerable change in the separation of the energy states due to the quantum confinement effect. Accordingly, it is of importance that the whisker width can be chosen freely, and, of equal importance, is that the width can be kept constant for extended whisker lengths. This, together with the possibility of positioning whiskers at selected positions on a substrate, will be necessary if an integration of whisker technology with current semiconductor component technology is to be possible. Several experimental studies on the growth of GaAs whiskers have been made, the most important reported by Hiruma et al. They grew III-V nano-whiskers on III-V substrates in a metal organic chemical vapor deposition—MOCVD—growth system—K. Hiruma, M. Yazawa, K. Haraguchi, K. Ogawa, T. Katsuyama, M. Koguchi, and H. Kakibayashi, *J. Appl. Phys.* 74, 3162 1993; K. Hiruma, M. Yazawa, T. Katsuyama, K. Ogawa, K. Haraguchi, M. Koguchi, and H. Kakibayashi, *J. Appl. Phys.* 77, 4471995; E. I. Givargizov, *J. Cryst. Growth* 31, 20 1975; X. F. Duan, J. F. Wang, and C. M. Lieber, *Appl. Phys. Lett.* 76, 1116 2000; K. Hiruma, H. Murakoshi, M. Yazawa, R. Ogawa, S. Fukuhara, M. Shirai, and T. Katsuyama, *IEICE Trans. Electron.* E77C, 1420 1994; K. Hiruma, et al, "Self-organised growth on GaAs/InAs heterostructure nanocylinders by organometallic vapor phase epitaxy", *J. Crystal growth* 163, (1996), 226-231. Their approach relied on annealing a thin Au film to form the seed particles. In this way, they achieved a homogeneous whisker width distribution, the mean size of which could be controlled by the thickness of the Au layer and the way this layer transforms to nanoparticles. With this technique, it is difficult to control the size and surface coverage separately, and it is virtually impossible to achieve a low coverage. The correlation between film thickness and whisker thickness was not straightforward, since the whisker width also depended on growth temperature, and there were even signs of a temperature-dependent equilibrium size of the Au particles. The authors also noticed a strong correlation between the size of the Au droplets de-posited from a scanning tunneling microscope tip and the resulting whisker width. For the free-flying Si whiskers grown by Lieber et al.,—Y. Cui, L. J. Lauhon, M. S. Gudiksen, J. F. Wang, and C. M. Lieber, *Appl. Phys. Lett.* 78, 2214, 2001—a clear particle-whisker size correlation has been shown.

It is necessary, if whiskers are to be used as electrical components, that there should be well-defined electrical junctions situated along the length of a whisker, and much work has been directed at achieving this—see for example Hiruma et al, "Growth and Characterisation of Nanometer-Scale GaAs, AlGaAs and GaAs/InAs Wires" IEICE Trans. Electron., Vol. E77-C, No. 9 September 1994, pp 1420-1424. However, much improvement is necessary.

Much work has also been carried out on carbon nanotubes (CNTs). Despite progress, research has been frustrated by a lack of control of the conductivity-type of CNTs and an inability to form 1D heterostructures in a controlled manner. Randomly formed interfaces as kinks between metallic and semiconducting parts of CNTs have been identified and studied (Yao et al, Nature, 1999, 402, 273) as have doping (pn) junctions in semiconducting CNTs (Derycke et al, Nano Letters, 2001, 1, 453) and transitions between CNTs and semiconductor (Si and SiC) nanowhiskers (Hu et al, Nature, 1999, 399, 48).

In a separate trend of development, attempts to fabricate 1D devices have been made since the late 1980s by top-down methods, as pioneered by Randall, Reed and co-workers at Texas Instruments—M. A. Reed et al., Phys. Rev. Lett. 60, 535 (1988). Their top-down approach, which still represents the state of the art for this family of quantum devices, is based on epitaxial growth of multi-layers defining the two barriers and the central quantum well. Electron-beam lithography is then used to define the lateral confinement pattern, together with evaporation of the metallic layers to form the top contact. A lift-off process is then used to remove the e-beam-sensitive resist from the surface, and reactive ion etching removes all the material surrounding the intended narrow columns. Finally, the devices are contacted via the substrate and from the top using a polyimide layer. In the studies of devices fabricated by this bottom-up technique, 100-200 nm diameter columns have been observed, however, with rather disappointing electrical characteristics and peak-to-valley currents at best around 1.1:1. An alternative approach to realizing low-dimensional resonant tunneling devices has been reported more recently, employed strain-induced formation of self-assembled quantum dots (I. E. Itskevich et al., Phys. Rev. B 54, 16401 (1996); M. Narihiro, G. Yusa, Y. Nakamura, T. Noda, H. Sakaki, Appl. Phys. Lett. 70, 105 (1996); M. Borgstrom et al., Appl. Phys. Lett. 78, 3232 (2001)).

SUMMARY OF THE INVENTION

The invention comprises a method of forming nanowhiskers, one-dimensional semiconductor nanocrystals, in which segments of the whisker have different compositions, for example indium arsenide whiskers containing segments of indium phosphide, wherein conditions for growth allow the formation of abrupt interfaces and heterostructure barriers of thickness from a few monolayers to hundreds of nanometers, thus creating a one-dimensional landscape along which electrons can move. In a preferred method of chemical beam epitaxy method (CBE), rapid alteration of the composition is controlled by the supply of precursor atoms into a eutectic melt of seed particle and substrate, supplied as molecular beams into the ultra high vacuum chamber. The rapid switching between different compositions is obtained via a sequence where growth is interrupted or at least reduced to an insignificant amount, and supersaturation conditions for growth are reestablished; at least, change, of composition and supersaturation is changed faster than any appreciable growth. With abrupt changes in material of the whisker, stresses and strains arising from lattice mismatch are accommodated by radial outward bulging of the whisker, or at least by lateral displacement of the atoms in the lattice planes near the junction.

Further, the invention includes a technique for the synthesis of size-selected, epitaxial nano-whiskers, grown on a crystalline substrate. As catalysts, size-selected gold aerosol particles are used, which enables the surface coverage to be varied completely independently of the whisker diameter. The whiskers were rod shaped, with a uniform diameter between 10 and 50 nm, correlated to the size of the catalytic seed. By the use of nano-manipulation of the aerosol particles, individual nano-whiskers can be nucleated in a controlled manner at specific positions on a substrate with accuracy on the nm level. The method of the invention enhances width control of the whisker by virtue of choice of nanoparticle. The nanoparticle may be an aerosol or a liquid alloy on the substrate may be made by starting from gold rectangles formed on the substrate which when melted form accurate diameter balls. Other materials may be used instead of gold as the seed particle, e.g. Gallium.

Whilst it is desirable in many applications to have nanowhiskers which are essentially constant in diameter, the shape of the whisker, and other attributes, may be varied by selectively changing the diffusion constant (diffusion coefficient) of the group III material, e.g. Ga, during whisker formation. This can be done by:

Lowering the temperature of the process—this produces whiskers tapered towards their free ends;

Increasing the pressure of the group V material;

Increasing the pressure of both group V and group III materials.

More specifically, the invention provides a method of forming a nanowhisker comprising:

depositing a seed particle on a substrate, and exposing the seed particle to materials under controlled conditions of temperature and pressure such as to form a melt with the seed particle, so that the seed particle melt rises on top of a column whereby to form a nanowhisker, the column of the nanowhisker having a diameter with a nanometer dimension;

wherein during the growth of the column, selectively changing the compositions of said materials whereby to abruptly change the composition of the material of the column at regions along its length, whilst retaining epitaxial growth, whereby to form a column having along its length at least first and second semiconductor segment lengths, the first semiconductor segment being of a material having a different band gap from that of the second semiconductor segment.

Functional 1D resonant tunneling diodes and other components and structures have been obtained via bottom-up assembly of designed segments of different semiconductor materials in III/V nanowhiskers. Electronic and photonics components comprising nanowhiskers have also been formed as heterostructures, with a single crystal formation, wherein length segments of the nanowhisker are of different materials, so as to create well defined junctions in the whisker between different band gap materials, whereby to create a component with a desired function.

Thus, the invention provides in general terms a heterostructure electronic or photonics component, comprising a nanowhisker having a column of a diameter with a nanometer dimension, the column having disposed along its length a plurality of length segments of different material composition with predetermined diametral boundaries between adjacent segments extending over a predetermined length of the nanowhisker column, such as to give desired band gap changes at the boundaries, in order to enable the component to carry out a desired function.

In a general aspect, the invention provides an electronic or photonic component, comprising a nanowhisker having a column with a diameter, which has a nanometer dimension, the column comprising along its length at least first and second length segments of different materials with an abrupt epitaxial composition boundary disposed between the first and second segments, wherein lattice mismatch at the boundary is accommodated by radial outward expansion of the nanowhisker at the boundary.

In another general aspect, the invention provides an electronic or photonic component, comprising a nanowhisker having a column with a diameter, which has a nanometer dimension, the column comprising along its length at least first and second length segments of different materials with an abrupt epitaxial diametral material boundary disposed between the first and second segments, wherein the transition between the composition of the different materials of the first and second segments occurs over an axial distance of not more than eight diametral lattice planes. Preferably, the transition between the composition of the first and second segment occurs over an axial distance of not more than 6, lattice planes, preferably not more than 5 lattice planes, still more preferably not more than 4 lattice planes, still more preferably not more than 3 lattice planes, still more preferably not more than 2 lattice planes and most preferably not more than one lattice plane.

In a further aspect, the invention provides an electronic or photonic component, comprising a nanowhisker having a column with a diameter which has a nanometer dimension, the column comprising along its length at least first and second length segments of different materials, the first segment having a stoichiometric composition of the form $A_{1-x}B_x$, and the second segment having a stoichiometric composition of the form $A_{1-y}B_y$, where A and B are selected substances, and x and y are variables, wherein an epitaxial composition boundary disposed between the first and second segments, comprises a predetermined gradual change from the variable x to the variable y over a predetermined number of diametral lattice planes. In a similar embodiment the compositions of the first and second segments of a nanowhisker of the invention can be represented by the formulas $A_{1-x}B_xC$, and $A_{1-y}B_yC$, respectively, wherein A and B represent elements of one group, e.g., group III, of the periodic table, and C represents an element of another group, e.g., group V, of the periodic table. The variables x and y may assume a value between 0 and 1, and represent different numbers within that range. Thus, such a nanowhisker is formed of a compound semiconductor that may vary in composition along its length, thereby incorporating a heterojunction. An example of such a compound semiconductor is $Al_xGa_{1-x}As$. A nanowhisker of the invention may be constructed to have, e.g., two lengthwise segments, a first segment having a composition $Al_{1-x}Ga_xAs$, wherein the variable x has a given value between 0 and 1 and a second segment having a composition $Al_{1-y}Ga_yAs$, wherein the variable y has a second value different from the value of x. Between the two segments is an interface within which the composition varies continuously from the composition of the first segment to that of the second segment, i.e., the value of the variable x changes continuously, and usually monotonically, to the value of the variable y. This interface thus constitutes a heterojunction. The transition may be made to occur over a predetermined number of diametral lattice planes by adjusting the conditions under which the whiskers are grown, as will be explained in more detail below. Furthermore, the growth conditions can be periodically adjusted to produce a plurality of such heterojunctions along the length of the nanowhisker.

The diameter of the nanowhisker is controlled by the invention to be essentially constant along the length of the nanowhisker, or having a defined variation, such as a controlled taper. This ensures precise electrical parameters for the nanowhisker, the controlled taper being equivalent to producing a voltage gradient along the length of the nanowhisker. The diameter may be small enough such that the nanowhisker exhibits quantum confinement effects. Although the diameter is precisely controlled, there will be small variations in the diameter arising from the processing method, in particular a radial outward bulging of the nanowhisker at a composition boundary in order to accommodate lattice mismatch in the epitaxial structure. In addition the diameter of one segment may be slightly different from that of another segment of a different material, because of the difference in lattice dimensions.

According to the invention the diameter of the nanowhiskers preferably will not be greater than about 500 nm, preferably not greater than about 100 nm, and more preferably not greater than about 50 nm. Furthermore, the diameter of the nanowhiskers of the invention may preferably be in a range of not greater than about 20 nm, or not great than about 10 nm, or not greater than about 5 nm.

The precision of formation of the nanowhisker enables production of devices relying on quantum confinement effects, in particular a resonant tunneling diode. Thus, an RTD has been developed wherein the emitter, collector and the central quantum dot are made from InAs and the barrier material from InP. Ideal resonant tunneling behavior, with peak-to-valley ratios of up to 50:1, was observed at low temperatures.

In a specific aspect, the invention provides a resonant tunneling diode, comprising a nanowhisker having a column of a diameter with a nanometer dimension, such as to exhibit quantum confinement effects, the column comprising along its length first and second semiconductor length segment forming respectively an emitter and a collector, and, disposed between the first and second semiconductor segments, third and fourth length segments of material having a different band gap from that of the first and second semiconductor segments, and a fifth central length segment of a semiconductor material having a different band gap from that of the third and fourth segments, disposed between the third and fourth segments and forming a quantum well.

A problem which arises with an electrical or photonic component formed from a nanowhisker is that of making efficient electrical contacts to the nanowhisker.

One method is to remove the nanowhisker from its substrate, by a mechanical scraping process, and to deposit the nanowhiskers on a further substrate, on their side lengthwise on the substrate. Metallised bond pads may then be formed over the ends of the nanowhisker, or alternatively the nanowhisker can be manipulated to be positioned over preformed contact pads.

Alternatively, in a method which may be better suited to mass-production, the nanowhiskers may be left on the substrate, with their base ends having been formed on an electrical contact. Once formed, the nanowhiskers may be encapsulated in a resin or glassy substance, and then contact pads may be formed over the surface of the encapsulation in contact with the free ends of the nanowhiskers. To assist in this, the catalytic particle melt, towards the end of the formation of the nanowhisker, may have extra conductive substances injected into it, so as to improve the electrical contact with the bond pads.

Further specific components are set forth in the appended claims, and described below. In particular, these include a heterobipolar transistor, and light emitting diodes and photodetectors.

Light emitting diodes are well suited to the present invention, since it is possible to construct them with an emission wavelength which can be selected at will from a continuous range of wavelengths over the UV, visible, and infrared regions.

The present invention provides a light emitting diode, comprising a nanowhisker having a column of a diameter with a nanometer dimension, such as to exhibit quantum confinement effects,
the column comprising along its length in sequence first, second and third semiconductor length segments comprising respectively an emitter, quantum well active segment and collector, said second segment having a different band gap from that of the first and second segments, and forming an active area of the light emitting diode.

One particular application of a light emitting diode is for emission of single photons. This is of use in various applications, but in particular in quantum cryptography, where unauthorised interception of a photon stream will inevitably cause destruction or modification of the photon, in accordance with quantum theory, and thus corruption of the transmitted signal—see P. Michler, A. Imamoglu, M. D. Mason, P. J. Carson, G. F. Strouse, S. K. Buratto, Nature 406, 968 (2000); C. Santori, M. Pelton, G. Solomon, Y. Dale, Y. Yamamoto, Phys. Rev. Lett. 86, 1502 (2001).

The invention provides a single photon light source, comprising a one dimensional nanoelement, having disposed along its length a volume of optically active material sufficiently small to form a quantum well, with tunneling barriers formed on either side of the quantum well, such that in use the quantum well is capable of emitting a single photon at a time.

Another form of light source in accordance with the invention is designed for terahertz radiation, beyond the far infrared. Much work has been done on superlattices, pioneered by Capasso and co-workers at Lucent Technologies. Their 'quantum cascade' lasers utilise intersubband photon emission in InGaAs/InAlAs/InP heterostructures, and have achieved room temperature (pulsed mode) operation at wavelengths up to 17 microns. See for example IEEE Spectrum July 2002, pages 23,24, "Using Unusable Frequencies" and F. Capasso, C. Gmachl, D. L. Sivco, and a. Y. Cho, "Quantum cascade lasers" Physics Today, May 2000, pp. 34-39.

The invention provides a source of terahertz radiation, comprising a nanowhisker having a column of a diameter with a nanometer dimension, the column including a multiplicity of layers of a first band gap semiconductor interleaved with a multiplicity of layers of a second band gap material, whereby to form a superlattice, the dimensions being such that electrons can move with a wave vector such as to radiate terahertz radiation.

In components, structures and processes according to the invention, an array of a large number of nanowhiskers may be formed extending from a substrate, essentially parallel to one another. There are various methods of forming such arrays, for example positioning an array of aerosol particles on the substrate to provide catalytic seed particles, depositing particles on the substrate from a colloidal solution, or forming on the substrate by a nanoimprint lithography (NIL) process (or by any other lithography process, e.g. e beam, UV, or X-ray), an array of areas of predetermined shape (rectangular or other shape) and thickness, which when heated, form balls of a desired volume to permit the nanowhisker growth process to proceed.

Such arrays may be employed as photonic crystals, solar cells comprised of a large number of photodetectors, field emission displays (FED), converters to convert an infrared image to a visible light image, all as described herein below. A further application is that of a polarisation filter.

In processes of the invention, an array of a large number of nanowhiskers may be employed to create a layer of an epitaxial material on a wafer substrate of a cheaper substance, for example silicon. A long-standing problem in the art is the formation of single crystal wafers of expensive III-V materials, from which chips can be formed. Much research has been made into forming single crystal layers on silicon wafer substrates—see for example WO 02/01648. However further improvements are desirable.

In accordance with the invention, a substrate of silicon or other substance is provided on which is grown a mask material, resistant to epitaxial growth, for example a dielectric material such as $SiO_2$, or $Si_3N_4$. An array of nanometer-dimensioned apertures is formed in the mask material, such as by a NIL process, and catalytic seed-forming material is deposited in the apertures. Alternatively an array of seed forming material areas is deposited on the substrate, and a layer of mask material is then deposited over the substrate and the seed particle areas. Application of heat causes melting of the seed particle areas to create the seed particles, and then growth of the nanowhiskers of the desired III-V or other material is initiated. After growth of the nanowhiskers, growth of the desired material continues, using the whiskers as nucleation centres, until a single continuous layer of the material is formed. The material is single crystal epitaxial. As preferred, the seed particle melt at the end of the nanowhiskers is removed at a convenient opportunity to avoid contamination of the epitaxial layer.

In a modification, mass growth of the epitaxial layer is initiated, using the seed particle melts as nucleation points, prior to formation of the nanowhiskers, and while the growth underneath the seed particles is still in the liquid phase.

In a further modification, microscopic V-grooves are formed in the upper surface of the silicon surface, for example <111> etchings in a <100> substrate. The seed particle forming areas are formed on the surfaces of the V-grooves, whereby the nanowhiskers grow at an angle to the substrate, and cross one another at the grooves. This makes for a more efficient growth of the epitaxial layer from the nanowhisker nucleation centres. Further, grain boundaries between domain areas with different growth phases are avoided; which has been a problem with prior processes.

The present invention thus provides in a further aspect a method for forming an epitaxial layer of a desired material on a substrate of a different material, the method comprising forming on a substrate a configuration of seed particle material areas, forming a layer of mask material around the seed particle areas, growing nanowhiskers from the seed particles areas of said desired material, and continuing to grow said desired material, using the nanowhiskers as growth sites, whereby to create an epitaxial layer of said desired material extending over said substrate.

In a further aspect of the invention, processes have been developed for forming nanowhiskers of material extending in the <100> direction, as opposed to the usual <111> direction for nanowhiskers. This has important applications, particularly for nitride materials which tend to grow in the <111> direction, but with many stacking faults, as the material alternates between a zinc blende and wurtzite structure.

The invention provides a method of forming nanowhiskers comprising providing a substrate, forming a configuration of seed particles on the upper surface, growing nanowhiskers from said seed particles which extend from the substrate initially in a <111> direction, and forming a short segment of a barrier material in said nanowhiskers such as to change their direction of growth to a <100> direction.

In a further aspect, the invention provides method of forming nanowhiskers, a method of forming nanowhiskers, comprising providing a substrate, forming a configuration of seed particles on the upper surface, growing nanowhiskers from said seed particles which extend from the substrate initially in a <111> direction, and changing the growth conditions of said nanowhiskers such as to change their direction of growth to a <100> direction.

The present invention also relates to one-dimensional nano-elements incorporated in MEMS devices—micromechanical devices.

In one aspect a substrate, for example of silicon, has a matrix of electrical contact areas formed on one surface. On each contact area, one, or a number, of nanowhiskers are formed from, for example, gold catalyst particles so as to be upstanding from the substrate's surface. Each nanowhisker, or group of nanowhiskers may therefore be individually addressable by electrical signals. Such a structure may make contact with the end, of a nerve or perhaps the nerves in the retina of an eye, and the electrodes may be activated so as to provide a repairing or artificial function for enabling the nerve. Thus for example, when applied in the retina of an eye, the structure may overcome certain blindness problems.

In another aspect a nanowhisker is provided, which may function as a nerve electrode or in other applications, wherein the whisker is formed of silicon or of a metal which may be oxidised, and the whisker is oxidised to form a layer of oxide along its length. The particle melt at the end of the whisker however including gold or other non-oxidisable material remains free of oxide and may therefore be used to form an electrical contact. This arrangement provides more precise electrical characteristics than nanowhiskers with exposed conductive material along their lengths and such nanowhiskers may be used as nerve electrodes or as devices where the capacitance of the nanowhisker is of importance. As an alternative, other materials may be used as the outer layer for example higher bandgap shells, for example where the whisker is formed of gallium arsenide, the outer layer may be gallium phosphide.

An important application of nanostructures is in micromechanical cantilever beams where a beam fixed at one end projects into space and may be subject to an external force, for example, electrical or weight or an external object or a chemical force, to give a bending of the cantilever. This bending may be detected for example by a change in electrical capacitance of the structure.

In a further aspect the present invention provides one or more nanowhiskers, which may or may not be oxidised in accordance with the above-mentioned aspect of the invention along their length to provide a cantilever or an array of cantilevers formed as a row or parallel beams. Such an arrangement may provide an order of magnitude or more sensitivity than a previous arrangement where an etching process has been used to produce the beams.

One application for such cantilevers is where the whiskers are formed with a material with a coating which is sensitive to certain organic molecules or biological molecules, such that a molecule, when making contact with a cantilever beam undergoes a certain chemical reaction. This produces certain stresses on the cantilever beam and causes bending of the beam, which may be detected by optical or electrical monitoring.

In a further specific aspect, a nanowhisker is formed on a substrate projecting up into an aperture of a layer of material, which is essentially insulative. The upper surface of the insulative layer has an electrically conductive material formed thereon. This electrically conductive material is roughly the same height from the substrate as the tip of the nanowhisker, which has a conductive seed particle melt thereon. By appropriate activation of the conductive material, the whisker may be made to mechanically vibrate within the aperture at a certain eigen frequency, for example, in the gigahertz range. During the period of a single vibration, a single electron is transferred from one side of the conductive material to the other via the seed particle melt. This creates a current standard generator, where the current I through the conductive material is equal to product of the frequency of vibration and the charge e of an electron: $I=f \cdot e$.

If the whisker is sensitised to attract molecules of a certain type, then the deposition of a molecule onto the whisker will change the inertial characteristics of the whisker and therefore its natural frequency of vibration. This may therefore be detected by electrical activation of the conductive material. This technique may be used to calculate the weight of a molecule to a very accurate degree.

BRIEF DESCRIPTION OF THE DRAWINGS

Preferred embodiments of the invention will be now be described merely by way of example with reference to the accompanying drawings, in which:

FIG. 4. Composition profile of an InAs nanowhisker, according to an embodiment of the invention, containing several InP heterostructures, using reciprocal space analysis of lattice spacing. (a) High-resolution TEM image of a whisker with a diameter of 40 nm. (b) Power spectrum of the image in (a). (c) An inverse Fourier transform using the information closest to the InP part of the split 200 reflection. InP (bright) is located in three bands with approximately 25, 8 and 1.5 nm width, respectively. (d) Superimposed images, using an identical mask over the InP and InAs parts of the 200 reflection, respectively.

(A) TEM image of the top end of a whisker with the double barrier clearly visible, in this case with a barrier thickness of about 5 nm (scale bar depicts 30 nm).

(B) The principle of the energy band diagram for the device investigated with the characteristic electronic states in the emitter region indicated (left).

(C) Current-voltage data for the same device as shown in A and B revealing a sharp peak in the characteristics, reflecting resonant tunneling into the ground state, E1z, with a voltage width of about 5 mV. This width can be translated into an energy width of the transition of about 2 meV, corresponding to the width of the shaded energy band in the emitter from which electrons tunnel. The device characteristics are shown in the inset, which provides a magnified view of the resonance peak for increasing voltage and for decreasing voltage.

Figure 9:
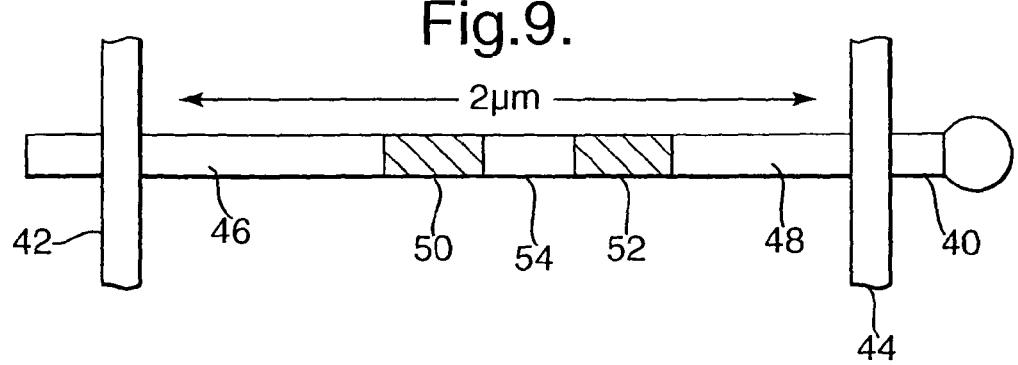
Figure 10:
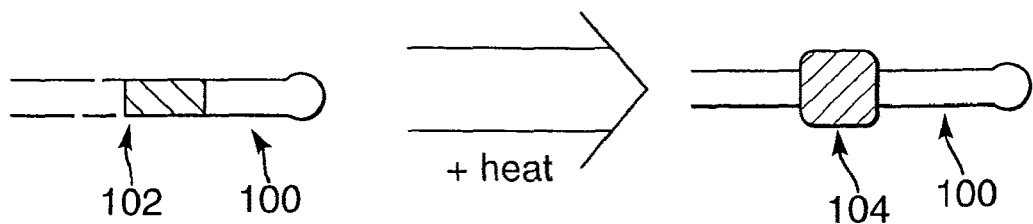
Figure 11:
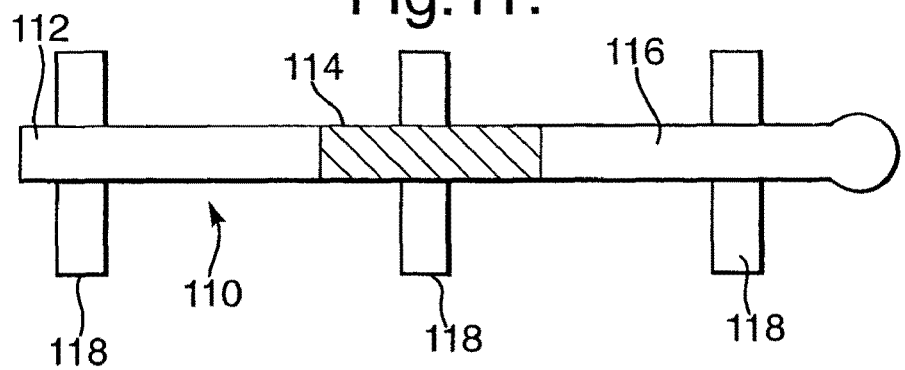
Figure 12:
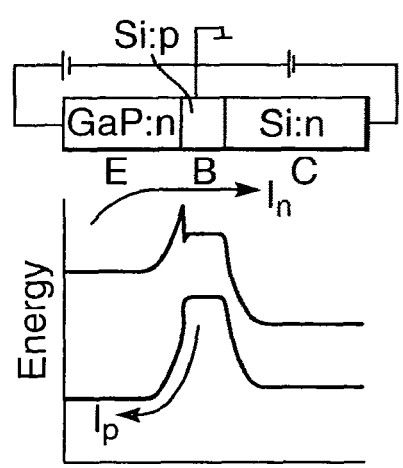
Figure 13:
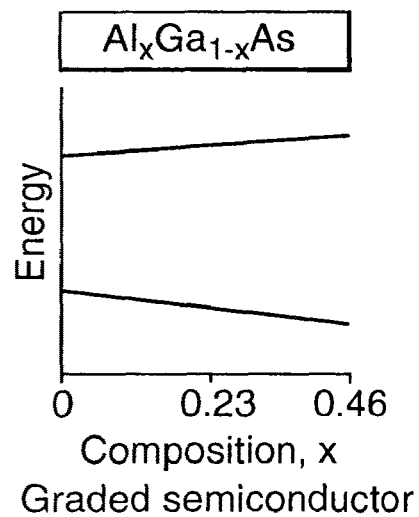
Figure 14A:
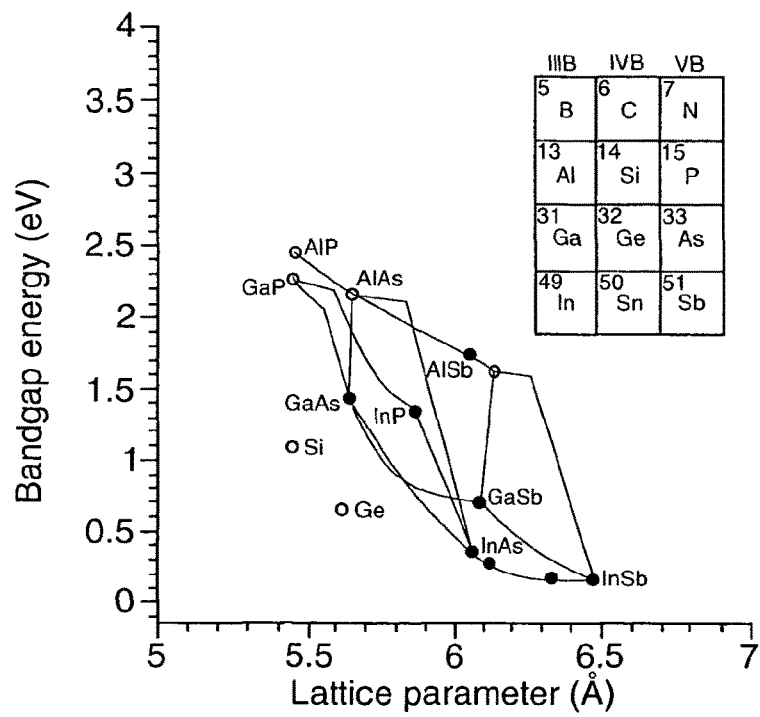
Figure 14B:
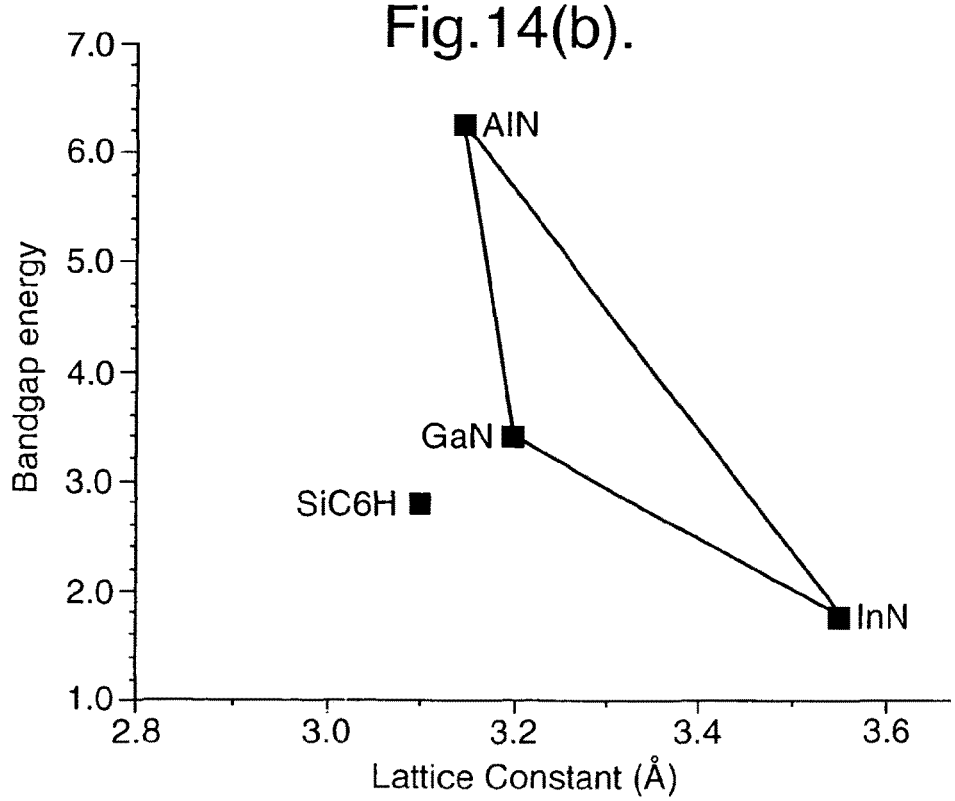
Figure 15:
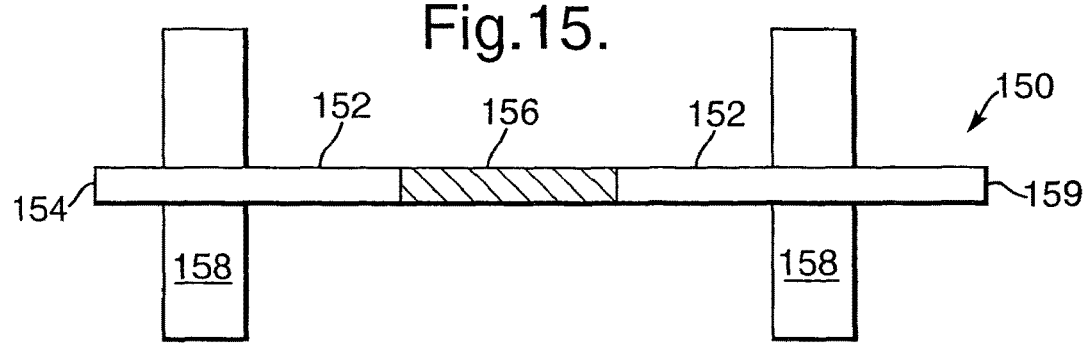
Figure 16:
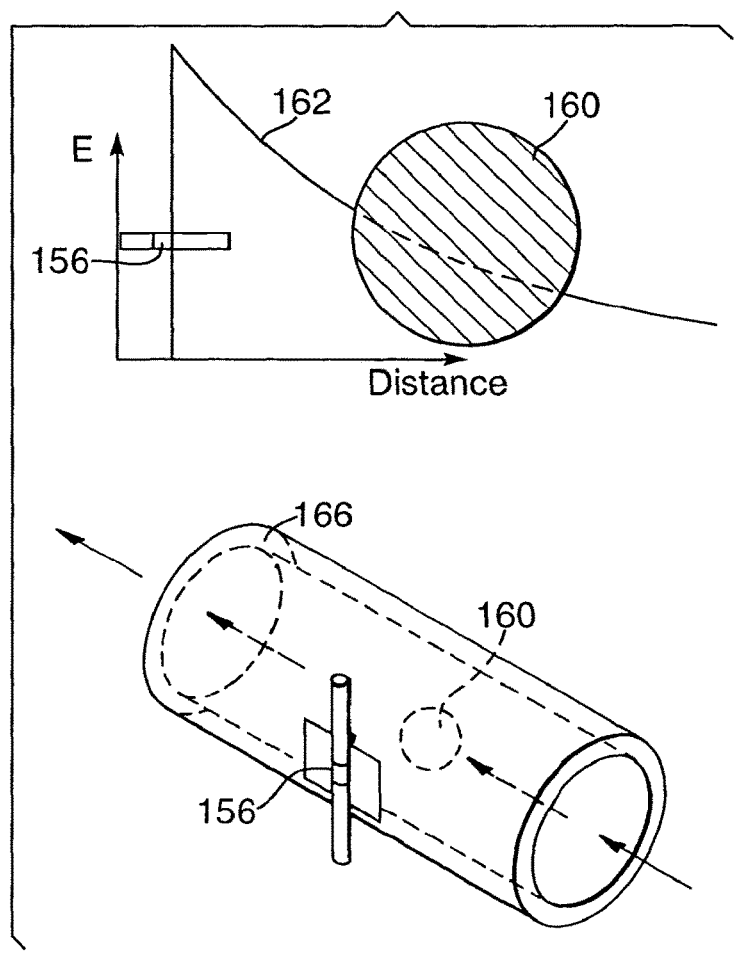
Figure 17:
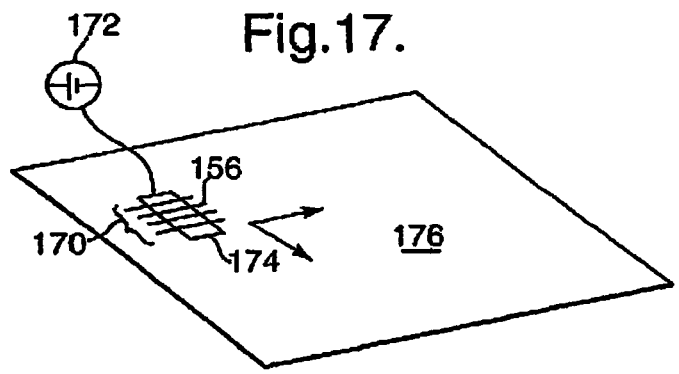
Figure 18A:
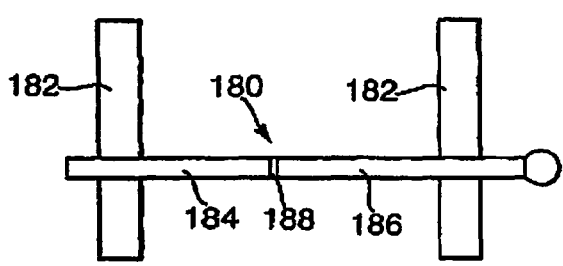
Figure 18B:
Figure 18C:
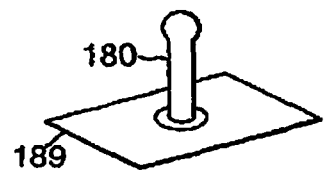
Figure 19A:
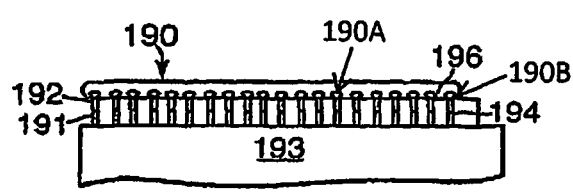
Figure 19B:
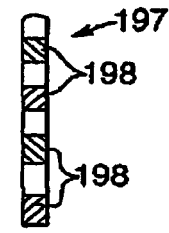
Figure 23A:
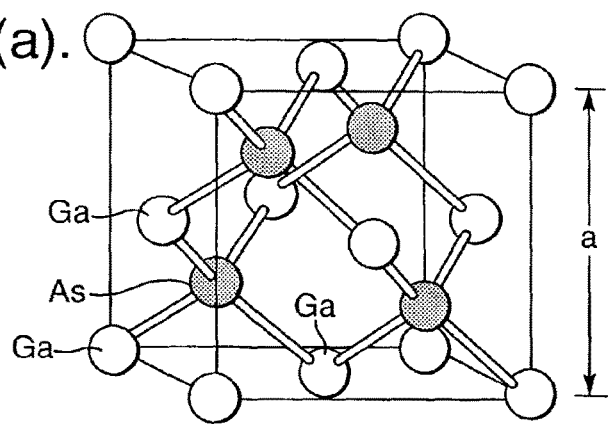
Figure 23B:
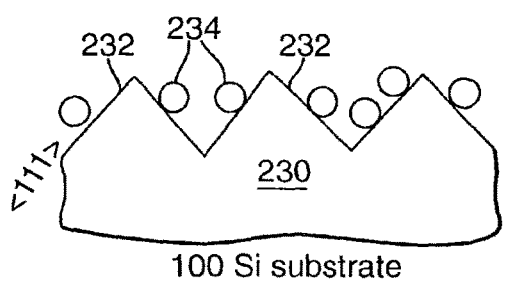
Figure 23C:
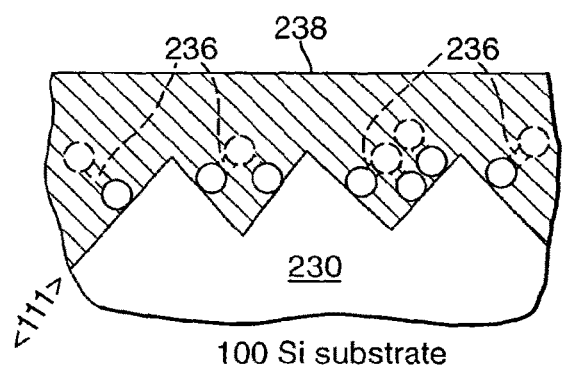
Figure 24A:
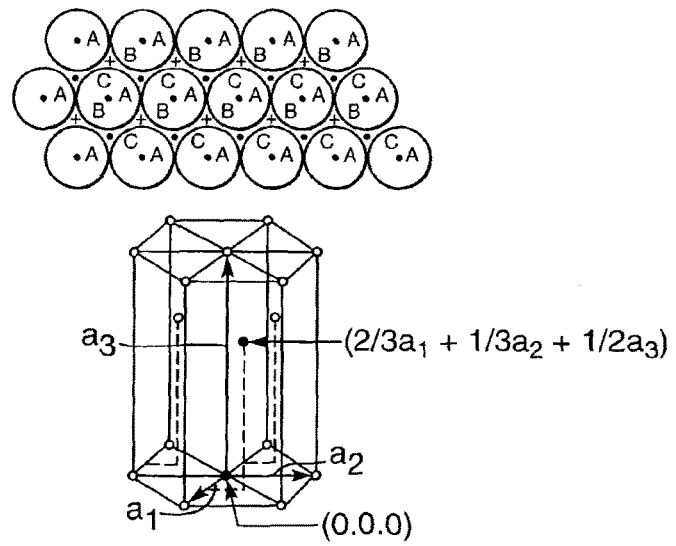
Figure 24B:
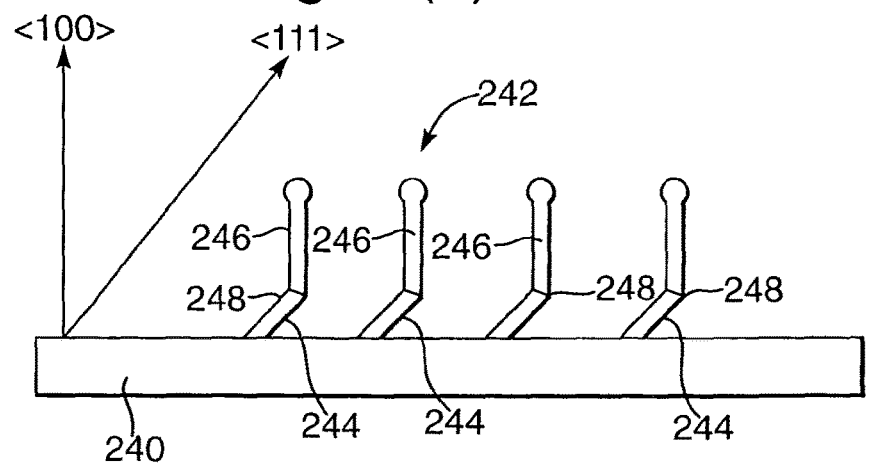
Figure 25A:
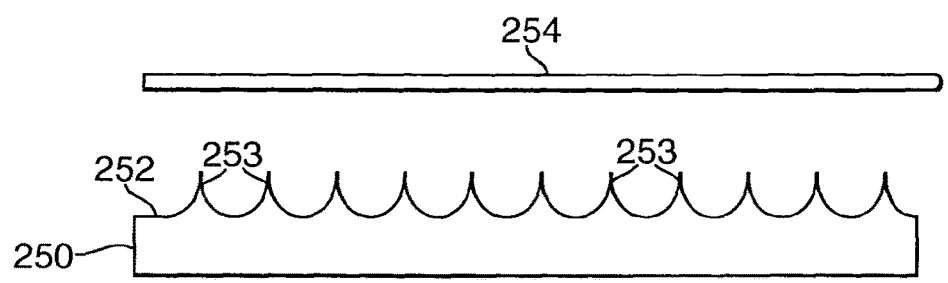
Figure 25B:
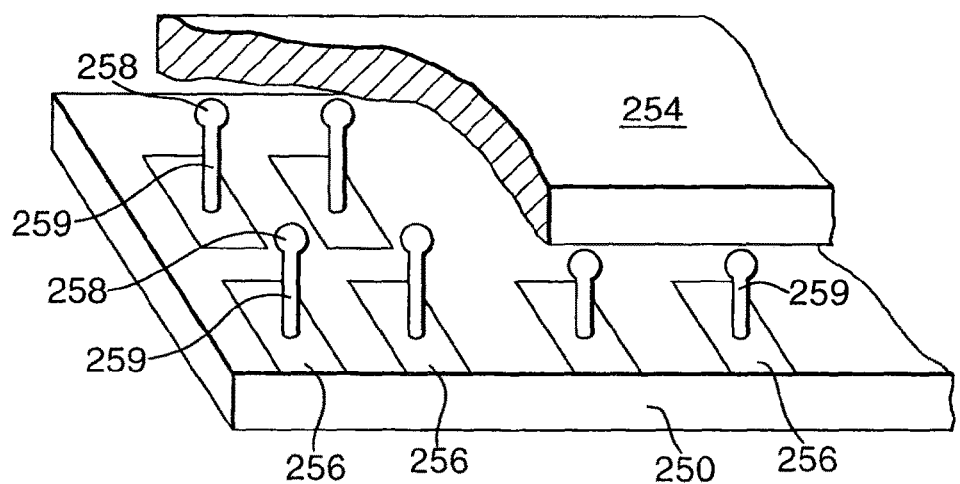
Figure 32:
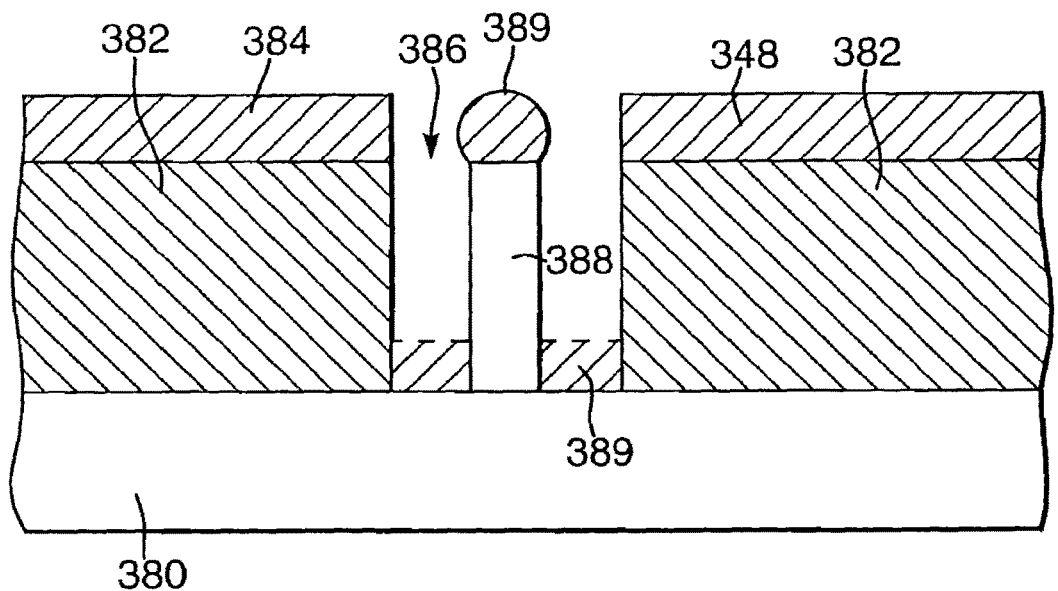
Figure 33:
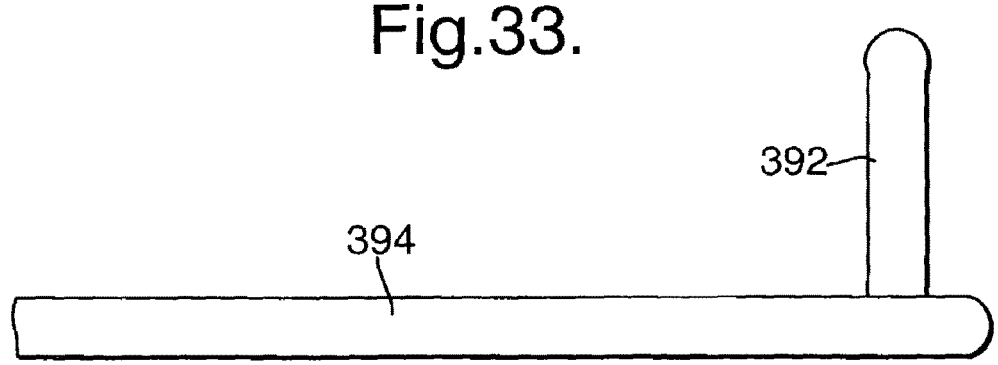

FIG. 9 is a schematic representation of the preferred embodiment of the resonant tunneling diode according to the invention;

FIG. 10 is a schematic representation of a further embodiment of the invention including a wide band gap insulating segment;

FIG. 11 is a schematic representation of a further embodiment of the invention comprising a hetero bipolar transistor (HBT);

FIG. 12 is a band gap diagram of the HBT correlated with the HBT structure;

FIG. 13 is a diagram showing band gap variation with compositional change of a ternary compound;

FIGS. 14A and 14B are diagrams showing band gap versus lattice dimensions for a variety of semiconductor compounds;

FIG. 15 is a schematic representation of an embodiment of the invention comprising a light emitting diode and laser;

FIG. 16 is a schematic representation of a further embodiment of the invention comprising the application of a laser to detection of individual molecules of desired species;

FIG. 17 is a schematic representation of a further embodiment of the invention comprising the application of an array of lasers to patterning photoresists in a NIL process;

FIG. 18A is a schematic representation of a further embodiment of the invention comprising a photodetector, and FIGS. 18B and 18C are variants thereof;

FIG. 19A is a schematic representation of a further embodiment of the invention comprising a solar cell, and FIG. 19B is a variant thereof;

FIG. 20 is a schematic representation of a further embodiment of the invention comprising a radiation source of terahertz radiation;

FIGS. 21A-C are schematic representations for explaining an embodiment of the invention comprising a photonic crystal, and FIG. 21D is a variant thereof for forming a 3-D photonics crystal;

FIGS. 22A-G are schematic representations of a further embodiment of the invention for forming a layer of material epitaxial with a substrate, wherein the lattices are not matched to one another;

FIGS. 23A-C are schematic representations for explaining a further embodiment of the invention for forming a layer of material epitaxial with a substrate, wherein the lattices are not matched to one another;

FIGS. 24A-B are schematic representations for explaining a further embodiment of the invention, for forming whiskers, which extend in a <100> direction, as opposed to the usual <111> direction;

FIGS. 25A-B are schematic representations of a further embodiment of the invention comprising a field emission display (fed), wherein the individual elements of the display are nanowhiskers and are individually addressable;

FIG. 26 is a schematic representation of a further embodiment of the invention comprising an arrangement for upconverting an image in the infrared region to a visible light region;

FIG. 27 is a schematic representation of a further embodiment of the invention comprising an antenna for infrared radiation;

FIG. 28 is a schematic representation of a further arrangement comprising a ferromagnetic whisker for spintronics applications;

FIG. 29 is a schematic view of a further embodiment of the invention comprising an array of selectively addressable electrodes for implantation into a nerve;

FIG. 30 is a schematic view of a further embodiment of the invention comprising a nanowhisker with an oxidised outer surface along its length;

FIG. 31 is a schematic view of a further embodiment comprising a row of nanowhiskers upstanding from a substrate and forming a cantilever arrangement;

FIG. 32 is a schematic view of a further embodiment of the invention comprising a nanowhisker arranged for oscillation and providing precise measurements of weight and frequency; and FIG. 33 is a schematic view of a further embodiment of the invention, comprising the tip of a Scanning Tunneling Microscope.

DESCRIPTION OF THE PREFERRED EMBODIMENTS

Methods of producing nanowhiskers, in accordance with the invention will now be described. Such methods may be suitable for production of resonant tunneling diodes described below, and other electronic and/or photonic components, as will become apparent.

Whiskers are highly anisotropic structures, which are spatially catalyzed by molten metallic droplets, often unintentionally introduced as contaminants, on a crystal surface. Gold is commonly chosen as catalyst, or seed particle, since it forms eutectic alloys with semiconductor materials or constituents such as Si, Ga, and In. The melting points of these eutectic alloys are lower than the usual growth temperatures for Si and group III-V materials. The molten metal droplet serves as a miniature, liquid phase, epitaxy system, where precursors are fed into it in the form of a vapour or, in this case, by a molecular beam in vacuum. The growth is usually referred to as vapour-liquid-solid growth. The electrical and optical properties of semiconductor nanowhiskers are fundamentally determined by their crystalline structure, shape, and size. In particular, a small variation of the width of the whisker provokes a considerable change in the separation of the energy states due to the quantum confinement effect. Accordingly, it is of importance that the whisker width can be chosen freely, and, of equal importance, is that the width can be kept constant for extended whisker lengths. This, together with the possibility of positioning whiskers at selected positions on a substrate, is necessary for an integration of whisker technology with current semiconductor component technology.

According to the invention, techniques have been developed for the synthesis of size-selected, epitaxial nanowhiskers, grown on a crystalline substrate. The Chemical Beam Epitaxy apparatus employed in the techniques described below is shown schematically in FIG. 3.

Chemical Beam Epitaxy (CBE) combines a beam epitaxial technique like Molecular Beam Epitaxy (MBE) and the use of chemical sources similar to Metal Organic Chemical Vapor Deposition (MOCVD). In MOCVD or related laser ablation techniques, the pressure inside the reactor is usually greater than 10 mbar and the gaseous reactants are viscous, which means that they have a relatively high resistance to flow. The chemicals reach the substrate surface by diffusion. CBE reduces the pressure to less than $10^{-4}$ mbar and the mean free path of the diffusants then becomes longer than the distance between the source inlet and the substrate. The transport becomes collision free and occurs in the form of a molecular beam. The exclusion of the gas diffusion in the CBE system means a fast response in the flow at the substrate surface and this makes it possible to grow atomically abrupt interfaces.

Figure 3:
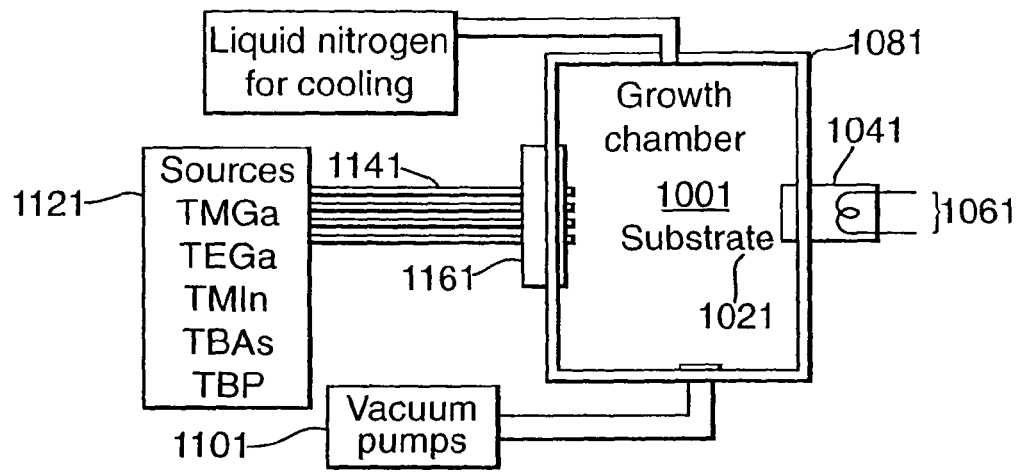
FIG. 3 is a schematic diagram of apparatus for carrying out the methods of this invention.

The CBE apparatus shown in FIG. 3 consists of a UHV (ultra-high vacuum) growth chamber 1001 where the sample 1021 is mounted on a metal sample holder 1041 connected to a heater 1061. Around the chamber there is a ring 1081 filled with liquid nitrogen that is called the cryoshroud. The cryoshroud pumps away species that don't impinge or that desorb from the substrate surface. It prevents contamination of the growing surface layer and reduces the memory effect. Vacuum pumps 1101 are provided.

The sources 1121 for CBE are in liquid phase and they are contained in bottles which have an overpressure compared to the chamber. The sources are usually as follows: TMGa, TEGa, TMIn, TBAs, TBP. The bottles are stored in constant-temperature baths and by controlling the temperature of the liquid source, the partial pressure of the vapor above the liquid is regulated. The vapor is then fed into the chamber through a pipe complex 1141 to, in the end of the pipe just before the growth chamber, a source injector 1161. The source injector is responsible for injection of the gas sources into the growth chamber 1001, and for generation of a molecular beam with stable and uniform intensity. The III-material, from the metal organic compounds TMIn (trimethylindium), TMGa (trimethylgallium) or TEGa (triethylgallium), will be injected by low temperature injectors to avoid condensation of the growth species. They will decompose at the substrate surface. The V-material is provided by the metal-organic compounds, TBAs (tertiarybutylarsine) or TBP (tertiarybutylphosphine). As opposed to the decomposition of the III-material, the V-material will be decomposed before injection into the growth chamber 1001, at high temperatures, in the injectors 1161. Those injectors 1161 are called cracking cells and the temperatures are kept around 900° C. The source beam impinges directly on the heated substrate surface. Either the molecule gets enough thermal energy from the surface substrate to dissociate in all its three alkyl radicals, leaving the elemental group III atom on the surface, or the molecule get desorbed in an undissociated or partially dissociated shape. Which of these processes dominates depends on the temperature of the substrate and the arrival rate of the molecules to the surface. At higher temperatures, the growth rate will be limited by the supply and at lower temperatures it will be limited by the alkyl desorption that will block sites.

This Chemical Beam Epitaxy method permits formation of heterojunctions within a nanowhisker, which are abrupt, in the sense there is a rapid transition from one material to another over a few atomic layers.

For the purposes of this specification, "atomically abrupt heterojunction", is intended to mean a transition from one material to another material over two or less atomic monolayers, wherein the one material is at least 90% pure on one side of the two monolayers, and the other material is at least 90% pure on the other side of the two monolayers. Such "atomically abrupt heterojunctions" are sufficiently abrupt to permit fabrication of heterojunctions defining quantum wells in an electrical component having a series of heterojunctions and associated quantum wells.

For the purposes of this specification, "sharp heterojunction", is intended to mean a transition from one material to another material over five or less atomic monolayers, wherein the one material is at least 90% pure on one side of the five monolayers, and the other material is at least 90% pure on the other side of the five monolayers. Such "sharp heterojunctions" are sufficiently sharp to permit fabrication of electrical components having one, or a series of, heterojunctions within a nanoelement, where the heterojunctions have to be accurately defined. Such "sharp heterojunctions" are also sufficiently sharp for many components relying on quantum effects.

As an illustration, in a compound AB used in the nanowhiskers of the invention, where A represents one or more selected elements of a first group and B represents one or more selected elements of a second group, the total proportions of the selected element(s) in the first group and the selected element(s) in the second group are predetermined to constitute a semiconductor compound designed to provide desired properties. The compound AB is considered 90% pure when the total proportion of the selected elements) within each group is at least 90% of its predetermined proportion.

EXAMPLE 1

FIGS. 1 and 3 show whiskers of predetermined sizes grown from several III-V materials, in particular, GaAs whiskers with widths between 10 and 50 nm. These whiskers can be grown rod shaped with a uniform diameter, in contrast to earlier reports on epitaxially grown nano-whiskers, which tended to be tapered, narrowing from the base towards the top. As catalysts, size-selected gold aerosol particles were used, whereby the surface coverage can be varied independently of the whisker diameter.

The whisker width in general is slightly larger than the seed particle diameter. This is mainly due to two factors: First, the gold particle incorporates Ga and possibly As from the substrate, which makes the particle grow. Second, when the particle melts, the base diameter of the liquid cap will be determined by the wetting angle between the alloy and the substrate surface. Simple assumptions give a widening of up to 50%, depending on temperature and particle diameter, and introduce a reproducible correlation between the particle diameter and the width of the whisker.

A GaAs<111>B substrate 10 was used, etched in HCL:H₂O, 1:10 to remove any native oxide and surface contaminants before aerosol deposition. The size-selected Au particles 12 were made in a locally constructed aerosol facility situated in a glove box 14 with ultra pure $N_2$ atmosphere. The particles are created in a tube furnace 16 by the evaporation/condensation method, at a temperature of about 1750° C., and are electrically charged by UV light at 18. The particles are size selected by means of a differential mobility analyzer DMA 20. The DMA classifies the sizes of charged aerosol particles by balancing their air resistance against their mobility in an electric field. After size classification, the particles were heated to 600° C., in order to make them compact and spherical. The setup gives an aerosol flow with a narrow size distribution, the standard deviation being <5% of the mean particle diameter. Still charged, the particles were deposited on the substrate 10 by means of an electric field E. Size-selected aerosol particles in the range between 10 and 50 nm were used to grow whiskers.

After aerosol deposition, some samples were transferred to an AFM Topometrix Explorer 24, also situated inside the glove box, and connected to the aerosol fabrication equipment. Thus, these samples were exposed only to sub-ppm levels of $H_2O$ and $O_2$ during the deposition and manipulation phases. With the AFM tip, specific particles 12 were selected and placed in a predetermined configuration, giving complete control of the positioning of individual seed particles.

The GaAs substrate 10 with Au aerosol particles 12, either arranged or as deposited, was then transferred into a chemical beam epitaxy CBE chamber. In a CBE configuration, GaAs growth occurs under vacuum/molecular beam conditions and with metal organic sources, in this case, triethylgallium TEG and tertiarybutylarsine TBA. The TBA is thermally pre-cracked to predominantly $As_2$ molecules, while the TEG usually cracks after impinging on the surface of the substrate. The growth is typically performed with a slight $As_2$ over-pressure, which means that the Ga flow determines the growth rate. Just before growth, the substrate was heated by a heater to 600° C. for 5 min, while exposed to an $As_2$ beam. In this step, the Au droplet can form an alloy with the GaAs constituents, whereby the Au particle absorbs some of the Ga from the substrate. The Au/Ga alloy forms at 339° C. However, this step also works as a deoxidizing step, taking away any new native oxide layer, originating from the transport to and from the glove box system. The oxide is expected to evaporate at 590° C., although this is not always the case. The volatility of the oxide can be followed with reflective high-energy electron diffraction RHEED. With a successful transfer, a streaky diffraction pattern, indicating a crystalline, reconstructed surface, can be seen already at temperatures lower than 500° C. Often, however, the oxide stays stable up to 590° C., sometimes as high as 630° C. The whisker growth was performed at substrate temperatures between 500 and 560° C., with a TEG pressure of 0.5 mbar and a TBA pressure of 2.0 mbar. After growth, the samples were studied by scanning and transmission electron microscopy SEM and TEM.

The resulting whiskers were rod shaped and fairly homogeneous in size, although their lengths varied slightly. The size homogeneity was clearly dependent on the volatility of the surface oxide. For samples with a hard oxide, as seen with RHEED, the size homogeneity was decreased. An oxygen-free environment is therefore to be preferred for reproducible results. At the growth temperatures described, no tapering of the whiskers was observed, irrespective of particle size. For whiskers grown below 500° C., however, there were clear signs of tapering. The growth of either rod-shaped or tapered whiskers, depending on temperature, is explained by the absence or presence of uncatalyzed growth on the surfaces parallel to the long axis of the whisker. The simplest surfaces of this orientation are <110> facets. Under ordinary CBE growth conditions, close to the ones used in these experiments, <110> facets are migration surfaces. However, at lower temperature, the Ga diffusion constant decreases, which initiates growth on the <110> facets. In MOCVD growth the Ga migration length is even smaller, which explains the typically tapered whiskers of prior workers.

Figure 1A:
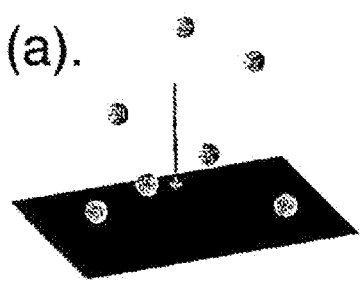
FIG. 1 is a schematic depiction of a fabrication technique according to the invention, for forming nanowhiskers: (a) deposition of size-selected Au aerosol particles onto a GaAs substrate; (b) AFM manipulation of the particles for the positioning of the whiskers; (c) alloying to make a eutectic melt between Au and Ga from the surface; (d) GaAs whisker growth.
Figure 1C:
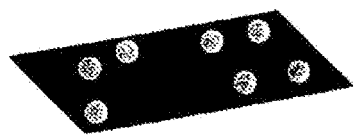
Figure 1B:
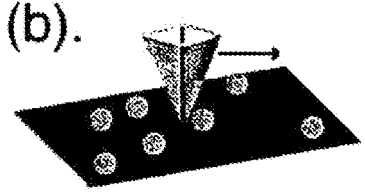
Figure 1D:
Figure 2A:
FIG. 2. (a) TEM micrograph of GaAs nano-whiskers grown from 10 nm Au aerosol particles. (b) SEM micrograph of a GaAs<111>B substrate with GaAs whiskers grown from 40 nm Au aerosol particles. (c) High-resolution electron microscope image 400 kV of GaAs whisker grown from an Au cluster. The inset shows a magnified part of the whisker.
Figure 2B:
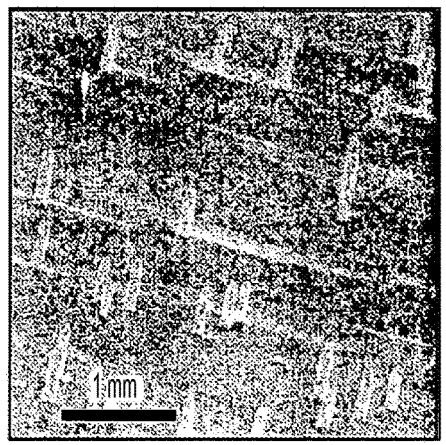
Figure 2C:
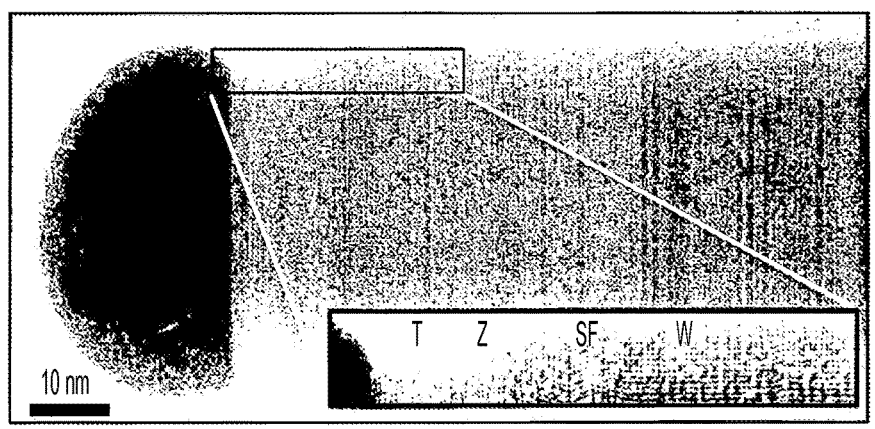

In FIG. 2a, a TEM image of a truss of 10±2-nm-wide whiskers grown from 10 nm particles is shown. The relatively low density of whiskers is illuminated by the SEM image in FIG. 2b, which is of a GaAs<111>B substrate with GaAs whiskers grown from 40 nm Au aerosol particles. In FIG. 2c, a single 40-nm-wide whisker is shown in a high-resolution TEM micrograph. The growth direction is perpendicular to the close-packed planes, i.e., 111 in the cubic sphalerite structure, as found by other groups. Twinning defects and stacking faults can also be observed, where the whisker alternates between cubic and hexagonal structure. Most of the whisker has the anomalous wurzite structure W, except for the part closest to the Au catalyst, which always is zinc blende Z. SF=stacking fault, T=twin plane. The change in image contrast at the core is due to the hexagonal cross-section.

Figure 5:
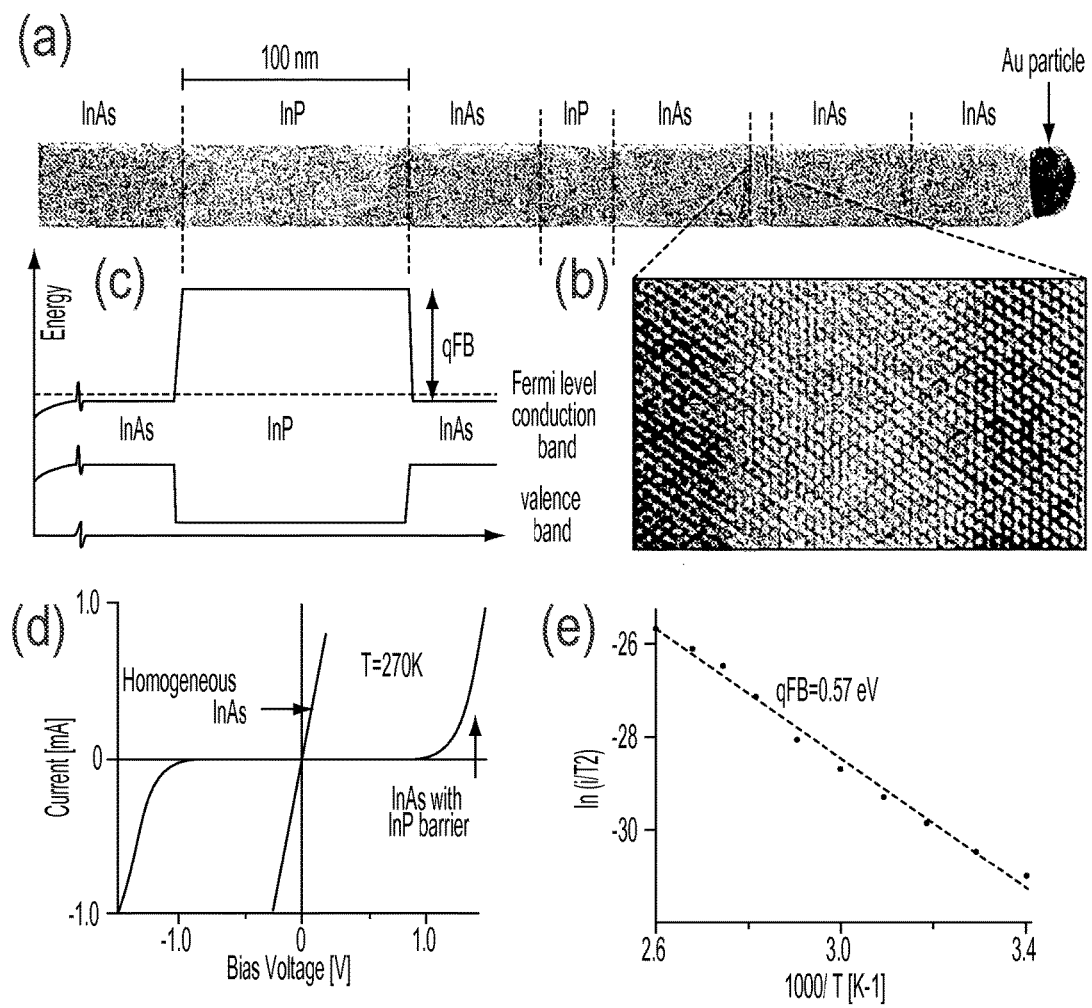
FIG. 5. Analysis of InP heterostructures inside InAs nanowhiskers. (a) TEM image of InP barriers (100, 25, 8, and 1.5 nm) inside a 40 nm diameter InAs nanowhisker. (b) Magnification of the 8 nm barrier region, showing crystalline perfection and the interface abruptness on the level of monolayers. (c) Simulated band-structure diagram of the InAs/InP heterostructures, including (left edge) ideal formation of ohmic contacts to InAs. (d) Ohmic I-V dependence for a homogeneous InAs whisker, contrasted by the strongly nonlinear I-V behavior seen for an InAs whisker containing an 80 nm InP barrier. (e) Arrhenius plot showing measurements of thermionic excitation of electrons across the InP barrier (at a bias of 10 mV), yielding a barrier height of 0.57 eV.

Such a growth method is used in the method described below with reference to FIGS. 4 to 6 for forming whiskers with segments of the whisker with different compositions. The method is illustrated by InAs whiskers containing segments of InP.

EXAMPLE 2

Conditions for growth of nanowhiskers allow the formation of abrupt interfaces and heterostructure barriers of thickness from a few monolayers to 100s of nanometers, thus creating a one-dimensional landscape along which the electrons move. The crystalline perfection, the quality of the interfaces, and the variation in the lattice constant are demonstrated by high-resolution transmission electron microscopy, and the conduction band off-set of 0.6 eV is deduced from the current due to thermal excitation of electrons over an InP barrier.

In this method, the III-V whiskers are grown by the vapor-liquid-solid growth mode, with a gold nanoparticle catalytically inducing growth, in the manner described above. Growth occurs in an ultrahigh vacuum chamber 100, FIG. 3, designed for chemical beam epitaxy (CBE). The rapid alteration of the composition is controlled by the supply of precursor atoms into the eutectic melt, supplied as molecular beams into the ultrahigh vacuum chamber. The rapid switching between different compositions (e.g., between InAs and InP) is obtained via a sequence where growth is interrupted as the indium source (TMIn) is switched off, followed by a change of the group III sources. Finally, the supersaturation conditions, as a prerequisite for reinitiation of growth, are reestablished as the indium source is again injected into the growth chamber.

For the abruptness of the interfaces, FIG. 4 shows TEM analysis of an InAs whisker containing several InP heterostructure barriers. In FIG. 4a, a high-resolution image of the three topmost barriers is shown, recorded with a 400 kV HRTEM (point resolution 0.16 nm). FIG. 4b shows a nonquadratic power spectrum of the NREM image, showing that the growth direction is along [001] of the cubic lattice. The reflections show a slight splitting due to the difference in lattice constants between InAs and InP. FIG. 4c shows an inverse Fourier transform, using a soft-edge mask over the part of the 200 reflection arising from the InP lattice. A corresponding mask was put over the InAs part of the reflection. The two images were superimposed as in FIG. 4d.

FIG. 5a shows a TEM image of an InAs/InP whisker. The magnification of the 5 nm barrier in FIG. 5b shows the atomic perfection and abruptness of the heterostructure interface. Aligned with the 100 nm thick InP barrier, the result of a 1D Poisson simulation (neglecting lateral quantization, the contribution of which is only about 10 meV) of the heterostructure 1D energy landscape expected to be experienced by electrons moving along the whisker is drawn (FIG. 5c). This gives an expected band offset (q¼B) in the conduction band (where the electrons move in n-type material) of 0.6 eV. This steeplechase-like potential structure is very different from the situation encountered for electrons in a homogeneous InAs whisker, for which ohmic behavior (i.e., a linear dependence of the current (I) on voltage (V)) is expected and indeed observed (indicated curve in FIG. 5d). This linear behavior is dramatically contrasted by the indicated I-V curve measured for an InAs whisker containing an 80 nm thick InP barrier. Strongly nonlinear behavior is observed, with a voltage bias of more than 1V required to induce current through the whisker. This field-induced tunnel current increases steeply with increasing bias voltage, as the effective barrier through which the electrons must tunnel narrows. To test whether the ideal heterostructure band diagram within the 1D whisker is valid, the temperature dependence of the current of electrons overcoming the InP barrier via thermionic excitation was measured. The result is shown in FIG. 5e, where the logarithm of the current (divided by $T^2$) is plotted as a function of the inverse of the temperature in an Arrhenius fashion, measured at a small bias voltage (V) 10 mV) to minimize band-bending effects and the tunneling processes described above. From the slope of the line fitted to the experimental data points an effective barrier height, q¼B, of 0.57 eV may be deduced, in good agreement with the simulation.

An added benefit of this approach to realizing heterostructures within 1D whiskers is the advantageous condition for combining highly mismatched materials, provided by the efficient strain relaxation by the proximity to the open side surface in the whisker geometry. In comparison, only a few atomic layers may be epitaxially grown in transitions between materials like InAs and InP with different lattice constants before either islanding or misfit dislocations occur, thereby preventing formation of ideal heterointerfaces.

Resonant Tunneling Diodes and Heterobipolar Transistors

The present invention also comprises, at least in preferred embodiments, functional 1D (one-dimensional) resonant tunneling diodes (RTDs) obtained via bottom-up assembly of designed segments of different semiconductor materials in III/V nanowires. Such RTDs comprise, in order, an emitter segment, a first barrier segment, a quantum well segment, a second barrier segment, and a collector segment. As is known to those skilled in the art, the barrier segments in RTDs are made thin enough that significant quantum tunneling of charge carriers is possible under conditions that favor such tunneling. In RTDs according to the invention, fabricated in nanowires, the nanowhiskers may be made thin enough so that the central quantum well is effectively a quantum dot. In a concrete example, the emitter, collector and the central quantum dot may be made from InAs and the barrier material from InP. In an example, excellent resonant tunneling behavior, with peak-to-valley ratios of up to 50:1, was observed.

According to the invention 1D heterostructure devices were fabricated utilizing semiconductor nanowhiskers. The whiskers were grown by a vapor-liquid-solid growth mode, size controlled by, and seeded from, Au aerosol particles, as more fully described above in Examples 1 and 2. Growth takes place in a chemical beam epitaxy chamber under ultra-high-vacuum conditions where the supersaturation of the eutectic melt between the Au particles and the reactants acts as the driving force for whisker growth.

Figure 6A:
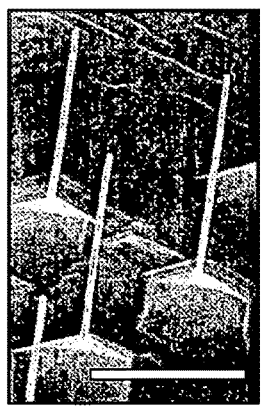
FIG. 6. Evaluation of transport mechanisms for single barriers of various thicknesses, for use in resonant tunneling diodes of the invention. (A) A SEM image of a whisker on the growth substrate. (Scale bar depicts 1 µm.) (B) An InAs/InP nanowhisker contacted by two alloyed ohmic contacts. (Scale bar depicts 2 µm.) (C) TEM image of an InAs whisker with an 8 nm InP segment perpendicular to the long axis of the whisker. (D) The current-voltage characteristics for three different barrier situations.
Figure 6B:
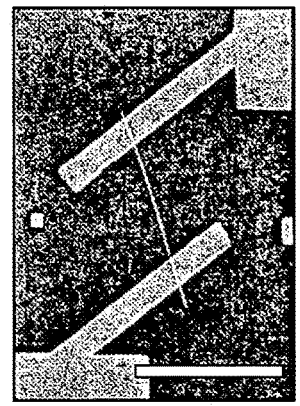
Figure 6C:
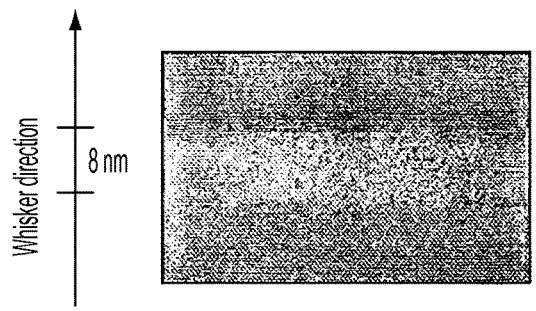
Figure 6D:
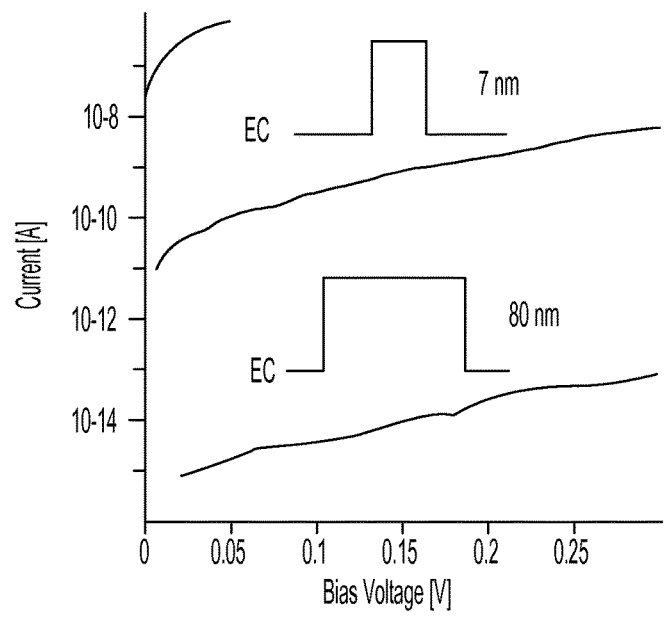
Figure 7A:
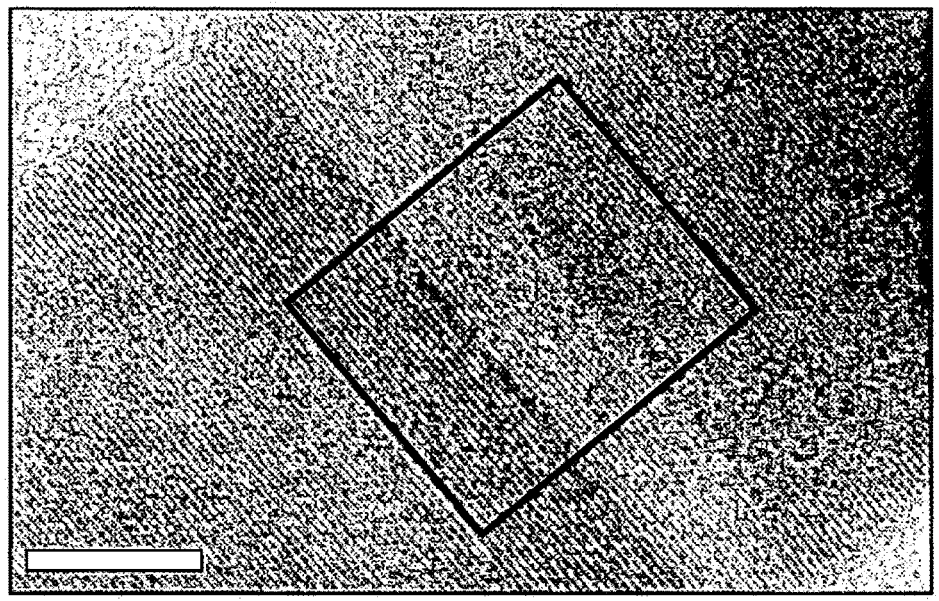
FIG. 7. High-resolution TEM imaging. (A) A TEM image of an InAs whisker grown in the <111> direction with two InP barriers for forming a first embodiment of the invention. (Scale bar depicts 8 nm.) (B) A one-dimensionally integrated profile of the boxed area in A. The width of the barrier is about 5.5 nm (16 lattice spacing), and the interface sharpness is of the order of 1-3 lattice spacings, judged by the jump in image contrast.
Figure 7B:
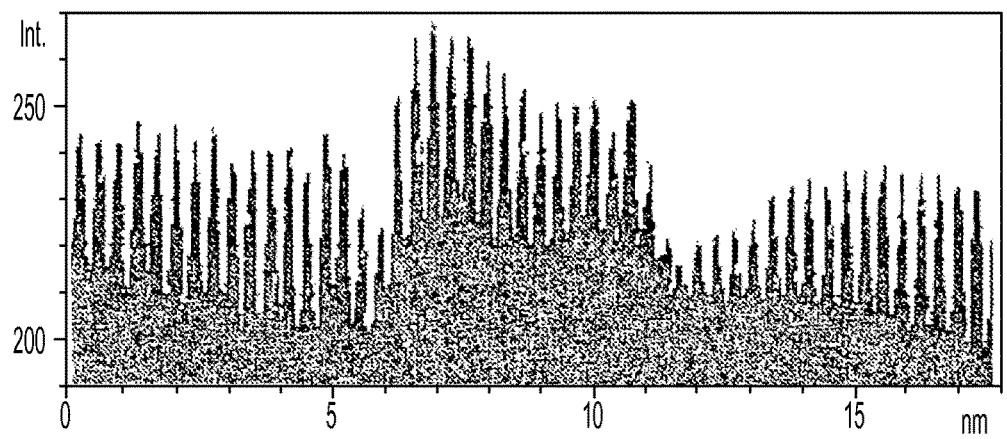

The incorporation of heterostructure segments into the whiskers is achieved via the following switching sequence (more fully described above); the group III-source beam is switched off to stop growth, and shortly thereafter the group V-source is changed. Once the group III-source is reintroduced into the chamber, the supersaturation is re-established and growth continues. In examples described below the material system used was InAs for the emitter, collector and dot, and InP as the barrier material. The aerosol particles were chosen so that the final whisker diameter was 40-50 nm. In order to prepare contacted electronic devices with single nanowhiskers as the active elements, the whiskers were transferred from the growth substrate to a $SiO_2$-capped silicon wafer, on top of which large bond pads were predefined by Au metal evaporation through a transmission electron microscope (TEM) grid mask. In FIG. 6B a scanning electron microscope (SEM) image of a nanowire device is shown, displaying the alignment capability in the e-beam lithography system, allowing positioning of metallic electrodes on the nanowires with an accuracy that is better than 100 nm. FIG. 6D shows the current-voltage (I-V) characteristics of a set of single-barrier devices, as the thickness of the InP barrier was varied from 80 nm down to zero. The thicker InP segments act as ideal tunneling barriers for electron transport, allowing only thermal excitation over this barrier (measured to be about 0.6 eV (23)) or tunneling made possible by the effective thinning of the barrier when a large bias is applied to the sample. In FIG. 6D it can be seen that almost no current flows through the thick InP barrier. In samples containing thinner single barriers (FIG. 2C), quantum tunneling is possible and electrons can penetrate barriers thinner than about 10 nm in thickness. In the extreme case with zero barrier thickness, the I-V characteristics are perfectly linear down to at least 4.2 K. In order to verify the crystalline quality and to evaluate the abruptness of the heterointerfaces high-resolution TEM investigations were performed. In FIG. 7A a magnification of a 5.5 nm thick InP barrier in a <111>-InAs nanowhisker is shown, where the (111) lattice planes can be clearly seen. From the integrated profile of the area in FIG. 7A the sharpness of the interfaces was determined to be 1-3 lattice spacings. The average spacing between the lattice fringes in the lighter band is 0.344 nm, corresponding well to d111=0.338 nm of InP. FIG. 7B is a one-dimensionally integrated profile of the boxed area in A. The width of the barrier is about 5.5 nm (16 lattice spacings), and the interface sharpness is of the order of 1-3 lattice spacings, judged by the jump in image contrast. The background is not linear due to bend and strain contrast around the interfaces. The difference in lattice spacing between the InP and the InAs is 3.4%, which corresponds well with the theoretical value of the lattice mismatch (3.3%).

Since the heterointerfaces were determined to be abrupt enough for making high quality quantum devices, double-barrier resonant tunneling devices may therefore be envisaged. A barrier thickness of about 5 nm was chosen. In FIG. 8A a TEM image of such a double barrier device structure formed inside a 40 nm wide nanowhisker can be seen. The barrier thickness is roughly 5 nm on either side of the 15 nm thick InAs quantum dot. Below the TEM image (FIG. 8B) the energy band diagram expected for the device is shown, with the longitudinal confinement (z-direction) determined by the length of the dot and the lateral confinement (perpendicular direction) depending on the diameter of the whisker. For this device only the lowest transverse quantized level was occupied (splitting of the order of 5 meV), with the Fermi energy indicated, determining the highest occupied longitudinal states filled with electrons. In between the two InP barriers the fully quantized levels of the central quantum dot are indicated, with the same sequence as schematically indicated in the emitter region for the transverse quantised levels, but with a greater splitting (of the order of 100 meV) between the longitudinal quantized states in the quantum dot and an approximate quantization energy for the ground state of $E1z=40$ meV. At zero applied bias, the current should be zero since no electronic states in the emitter are aligned with any states in the central dot because of the difference in energy quantization between the dot and the emitter. As the bias is increased the states in the dot will move towards lower energy and, as soon as the lowest dot-state is aligned with the Fermi level, the current starts to increase (here the Fermi level is assumed to lie between the two lowest states in the emitter). When the dot-state falls below the energy level of the first emitter state the current again drops to zero, resulting in the characteristic negative differential resistance.

Figure 8C:
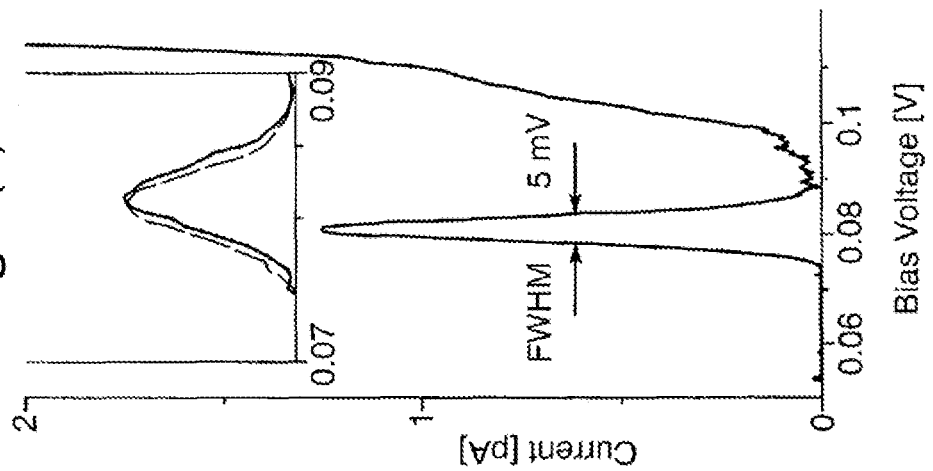
FIG. 8. A resonant tunneling diode (RTD) forming an embodiment of the invention.
Figure 8A:
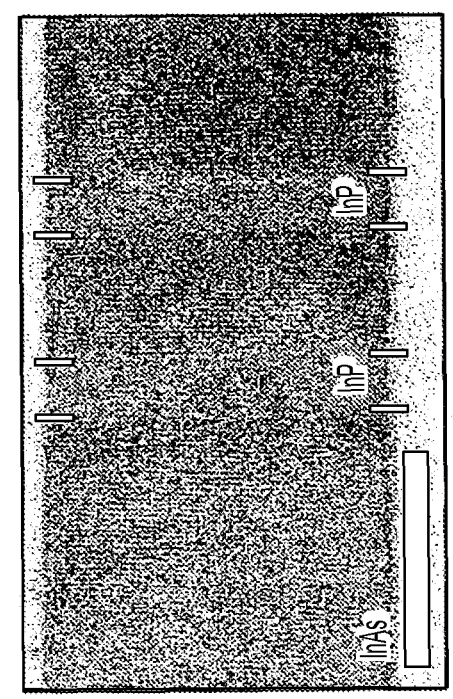
Figure 8B:
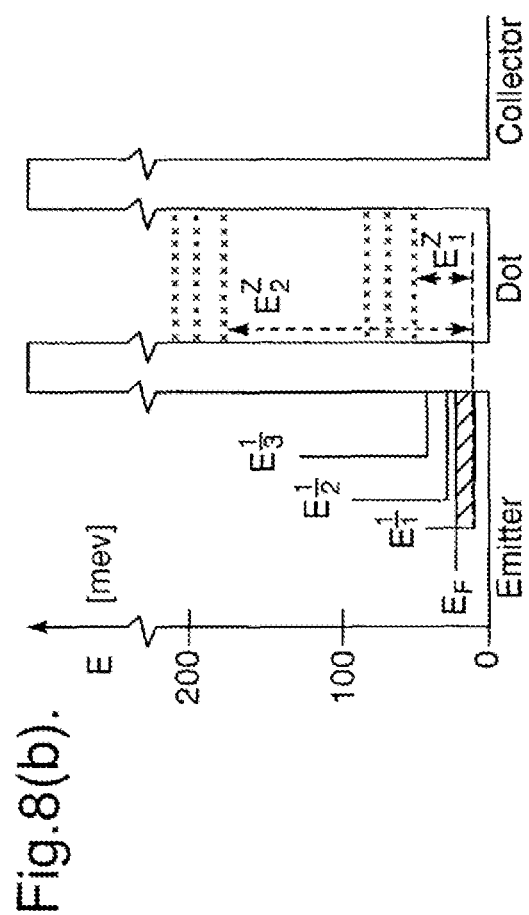

The electrical properties of this 1D DBRT device are presented in FIG. 8C, showing almost ideal I-V characteristics, as expected for such a device. The I-V trace shows no current below a bias of around 70 mV, corresponding to the bias condition for which electrons must penetrate both barriers plus the central InAs segment to move from the emitter to the collector. At a bias of about 80 mV a sharp peak is seen in the I-V characteristics, with a half-width of about 5 mV in bias (which can be translated into an energy sharpness of the resonance of about 1-2 mev). The peak-to-valley ratio of the 80 mV peak is extremely high, about 50:1, and was seen in different samples investigated. After the deep valley, the current increases again for a bias of about 100 mV, with some unresolved shoulder features observed on the rising slope. Note that the I-V trace for increasing bias voltage coincides with that for decreasing bias voltage indicating that the device characteristics are highly reproducible and exhibit negligible hysteresis effects. In addition, the 80 mV appears similarly in the reverse bias polarity. In this case the peak is only slightly shifted (5 mV) suggesting a high symmetry of the device structure. Accordingly, these results report the investigation of the materials and barrier properties of single heterostructure barriers inside semiconductor nanowires, bridging the gap from thick barriers, for which only thermal excitation above the barrier is possible, down to single barrier thickness, for which tunneling through the barrier dominates.

With this approach one-dimensional, double-barrier resonant tunneling devices have been prepared, with high-quality device properties, and an energy sharpness of about 1 meV and peak-to-valley current ratio of 50:1.

Referring now to FIG. 9, a preferred embodiment of a resonant tunneling diode is shown, having a nanowhisker 40 extending between collector and emitter contacts 42, 44, 2 microns apart. First and second InAs portions 46, 48 of the whisker make electrical contact with respective contacts 42, 44. Barrier portions 50,52 of InP separate a central quantum dot or quantum well portion of InAs, 54, from the emitter and collector portions. The length of the portion 54 is around 30 nm. The precise dimensions will be selected in dependence upon bandgap barrier height, etc., in order to achieve appropriate quantum confinement.

The diode operates in the conventional way of RTDs; for an explanation of the theory of operation; see, for example, Ferry and Goldnick, Transport in Nanostructures, CUP 1999, pp 94 et seq.

In the RTD of FIG. 9, the segments 50, 52 may be replaced by a wide band gap insulating material, in the manner shown in FIG. 10. Referring to FIG. 10, an embodiment is shown having an insulating segment. A germanium whisker 100 is grown by the processes described above, having a short segment 102 of silicon. Lattice mismatch is accommodated by radial outward expansion of the whisker. This silicon dot is oxidised by heat to give a large silicon dioxide spacer 104 within the germanium whisker. This has an extremely stable large bandgap offset. Aluminium can be used instead of silicon. This embodiment can be used for example for tunneling effects, in the embodiment of FIG. 9.

As regards making electrical contacts with the collector and emitter portions of the embodiment of FIG. 9, this can be done in different ways. The whisker may be positioned across large metallised bond pads, as shown in FIG. 9. Alternatively, the nanowhisker may be positioned on a substrate, its position identified by a suitable scanning method, and then bond pads may be formed over the ends of the whisker by a metallization process. Another alternative is to leave the nanowhisker extending from the substrate, where it makes contact at its base with an electrical contact, to encapsulate the whisker in a resin or glassy substance, and then form an electrode over the encapsulation, making electrical contact with the whisker tip. This latter method may be more suitable for integration with other electrical components and circuits.

Referring now to FIGS. 11 to 14, an embodiment of the invention is disclosed which comprises a heterojunction bipolar transistor (heterobipolar transistor; HBT); this differs from the conventional bipolar transistor in that different band gap materials are used in the transistor. For example, a nanowhisker 110 may have an emitter segment 112 of GaP, connected to a base segment 114 of p-doped Si, which is in turn connected to an n-doped collector segment 116 of Si. Metallisation electrodes 118 make contact with the respective segments 112, 114, and 116. FIG. 12 shows a band gap diagram for the HBT. By reason of the relatively wide band gap of the emitter, minority current flow from the base to the emitter is inhibited. The depletion area between the base and collector is characterized by a gradual change in doping from p-type to n-type. As an alternative, the base and collector may be formed of ternary or quaternary materials, being a stoichiometric composition, and the composition gradually changes over a large number of lattice planes, say 100 to 1000, to give the required depletion region field. Change in energy band gap with composition is shown in FIG. 13 for the ternary mixture $Al_xGa_{1-x}As$.

FIG. 14 shows variation in bandgap energy and lattice parameters for a variety of III-V materials. It will be appreciated that with the method of forming nanowhiskers according to the invention, it is possible to form heteroepitaxial junctions of materials with widely different lattice parameters, e.g. GaN/AlP, the lattice mismatch being accommodated by radial bulging of the whisker.

Photonics Components

Referring to FIG. 15, this shows schematically an extremely small LED capable of single photon emission. Single photon emission is of importance, for example for quantum photography or detection of individual molecules of molecular species. A whisker 150 has anode and cathode outer regions 152 of indium phosphide either side of an inner region 156 formed of indium arsenide, so as to define a quantum well. Regions 152 are connected to respective anode and cathode electrical contacts, formed as metallisation areas 158. In contrast to planar devices, where because of the need for lattice matching and for relieving mismatch strain, only certain wavelengths are possible, an important point of this embodiment is that the wavelength of the LED is fully variable since the materials making up the diode may be of any desired composition to achieve a desired wavelength of emission (see FIG. 14 discussed above), since lattice mismatch is accommodate by radial outward bulging of the whisker. Since the materials may be stoichiometric compositions, the wavelength is continuously variable across the range from 1.5 ev to 0.35 ev. A one-dimensional structure requires much less processing than prior art layered structures and is made by a self-assembly process, with the whole structure between the electrical contacts. If a laser construction is required, Fabry Perot (FP) cleavage planes 159 are formed spaced an appropriate distance apart. As an alternative, regions 159 are formed as mirrors comprising superlattices. The superlattices may be formed as alternating sequences of InP/InAs, the sequence alternating over segments of only a few lattice planes, as is known to those skilled in the art.

LEDs, lasers, and other micro cavity structures are often fabricated with gallium nitride (GaN). Whilst nitrides have a number of advantages, particularly in optics, problems with nitrides are that firstly they are filled with dislocations and that secondly there is a lack of suitable substrates (sapphire being one commonly used substrate). Whiskers can be made with defect-free nitrides, and there is not a problem of lattice matching to a substrate. A regular FP laser can be made, with the structure of FIG. 15, with dimensions less than 300 nm, preferably of the order of 100 nm. It is a bottom up structure, which is well suited to reading DVDs and writing thereto. Nitride systems are quite well suited for whisker growth.

The light source-emitting region 156 can be made as small as about 20 nm$^3$. This represents an extreme example of a point source and can be used, as indicated schematically in FIG. 16 to locally excite individual biological cells 160. The light source 156 provides a near field 162 (exponentially decaying) which excites the cell 160 since the physical spacing between the light source and object is a fraction of a wavelength. It is of use in DNA sequencing, and, as shown, the source 156 may be mounted in a groove 164 of a glass capillary tube 166. The cell flows along the tube as part of a fluid mixture, and flows past the source 156.

Referring to FIG. 17, this shows an embodiment of the invention adapted for Nano Imprint Lithography (NIL), where an array 170 of whiskers 156, providing point sources of light, are individually addressable by an energisation source 172. The array is mounted on a carriage 174 movable over the surface of a resist material 176. The carriage is movable in steps of 20 nm, and at each step, the whiskers 156 are selectively energised in order to illuminate the material 176 with near field light, and to create a desired developable pattern in the resist 176.

Referring to FIG. 18A, a photodetector is shown in accordance with the invention. For example, a nanowhisker 180 may extend between metallised contact pads 182. There is typically a high contact resistance, between 10 KO to 100 KO, arising from small contact areas between pads 182, and whisker 180. The whisker may comprise an n-doped indium phosphide portion 184, and a p-doped indium phosphide portion 186, with a p-n junction 188 between, which may be abrupt, or may extend over a large number of lattice planes. This arrangement is suitable for detecting light with wavelengths 1.3 micron or 1.55 microns. As indicated in FIG. 14, any desired compositional "match" may be used, and therefore the materials can be modified for detection of any wavelength, from 1.55 microns or less. As an alternative, a PIN or Schottky diode structure may be used. A PIN structure, as shown in FIG. 18B has an intrinsic semiconductor material segment 188 between the two semiconductor portions 184 and 186. The whisker is constructed as described with reference to FIG. 10. A Schottky diode structure, as shown in FIG. 18C has a base portion 189 formed as a metallisation contact from which the whisker extends; the interface between the contact and the whisker forms the Schottky diode. The lower frequency limit on detection of radiation is in the terahertz region of the electromagnetic spectrum.

Referring to FIG. 19A, a solar cell application is shown for the photodetector structures of FIG. 18. Millions of whiskers 190, each having p- and n-doped portions 191, 192 are formed on a substrate 193, doped (P+). The whiskers are formed by growth using gold, or other, nanoparticles, deposited onto substrate 193, e.g., from an aerosol. The whiskers may be encapsulated in plastics 194 and have a transparent tin oxide electrode 196 on the upper surface, which makes contact with the free ends of the whiskers to permit electrical current to flow along the length of the whiskers. The structure is extremely efficient in trapping light since each whisker is 100% reliable. The overall efficiency is between 35 and 50% and is of use in multi-bandgap solar cells. By contrast amorphous silicon grown at 300° C. gives an efficiency of about 10%. Crystalline silicon gives an efficiency of about 15% and special purpose III-V solar cells for space applications are grown at 400° C. and have an efficiency of up to 25%. Grätzel solar cells for space applications have titanium dioxide nanoparticles painted on solar panels, with an appropriate dye; such cells have an efficiency up to about 8%.

Referring to the modification shown in FIG. 19B, each whisker of the solar cell array is modified to the form shown 197, with different segments of different materials 198 along its length. These materials are selected so that the p-n junctions absorb light at different wavelengths. The point along the whisker at which the whisker is most sensitive to light of a particular wavelength depends on the precise structure of the solar cell and factors such as reflection and refraction within the structure.

The embodiment of FIGS. 19A-B is inexpensive, since the growth conditions are inexpensive, and further only very small quantities of expensive materials are required. In alternative constructions, the whiskers can be silicon (least expensive) or germanium. The length of the whiskers is 1 or 2 microns. A PN junction is achieved by doping the whisker along part of its length, or by forming Schottky barriers, as indicated in FIG. 18C at the base of the whisker.

Referring to FIG. 20, an embodiment is shown, which is a source of very long wavelength infrared radiation, e.g., at terahertz frequencies. An indium phosphide nanowhisker 200 has a series of very thin indium arsenide stripes 202, separated by spacer stripes 204 of indium phosphide. The stripes are grown by the process described above. Each stripe 202, 204 is a few lattice planes wide, and the stripes create a superlattice 206. By applying a voltage across electrode contacts 208, electrons move across the superlattice. The superlattice creates a series of quantum well bandgaps (potential wells) which, according to the Bloch theorem will give a conduction band with allowable regions of electron wave number or momentum k—these allowable regions correspond to terahertz frequencies, thereby to create terahertz emission.

FIGS. 21A-21D illustrate an embodiment of the invention, implemented as a photonic crystal. Photonic crystals are well known—see for example copending application WO 01/77726. In the main, prior methods of forming photonic crystals involve etching air holes in a substrate according to a predetermined lattice pattern. A concept of this embodiment is to use a patterning technique for defining a crystal lattice pattern on a substrate, but to grow nanowhiskers to define the crystal, rather than etching holes. This has numerous advantages in that etching techniques are not as reliable (etching harms the substrate surface) as a bottom up technique of growing whiskers. Therefore the whisker technique is more accurate and gives higher quality; and simplicity, as well as economy in that fewer process steps are required.

Referring to FIG. 21A, a substrate 210 has a triangular lattice pattern of square patches 212 of gold about 300 nm$^2$, spaced apart by a distance of 300 nm, the patches having been formed by ebeam lithography, UV lithography or a nanoimprint lithography (NIL) process. The substrate is initially prepared before gold deposition as a clean substrate without oxide contaminants. The substrate is heated to melt the gold rectangles so that they form balls 214, about 100 nm diameter, as shown in FIG. 21B, which are then annealed. Whiskers 216 are then grown by the process as described in Example 1, about 100 nm wide to form a photonics crystal, as shown in FIG. 21C.

It is possible in accordance with the invention to define three-dimensional photonic crystals by whisker formation. This can be done as indicated in FIG. 21D by forming each whisker with a sequence of segments 217, 218 of different materials, for example an alternating sequence of III-V materials such as InAs/GaAs, or group IV materials such as Ge/Si, in accordance with the method of Example 2, so that at intervals along each whisker, segments are provided with an appropriate refractive index to form a photonic band gap.

Single Crystal Layers of III-V Materials

Figure 22A:
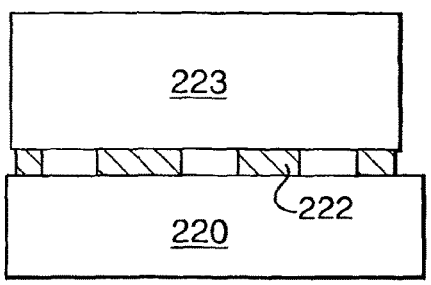
Figure 22B:
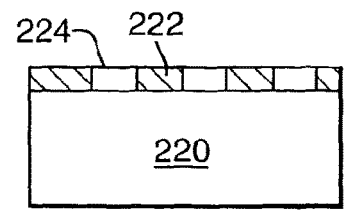
Figure 22C:
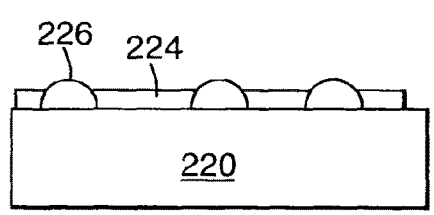
Figure 22D:
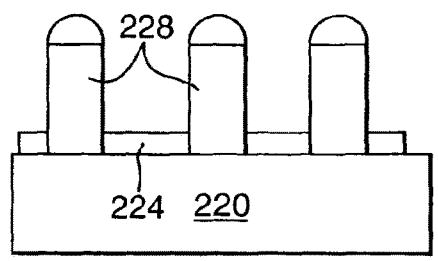
Figure 22E:
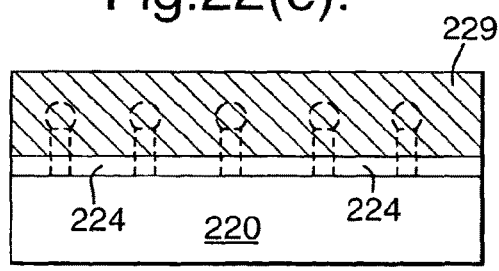

Referring to FIGS. 22A-22G, an embodiment of the invention is shown for growing epitaxial layers of a desired material on a substrate. As shown in FIGS. 22A & B, a silicon or gallium arsenide substrate 220 has formed on an upper surface rectangles 222 of gold, indium or gallium, which are positioned on the substrate by a stamp 223 in a NIL process or as described in Example 1. An epitaxial mask deposit 224 a few nanometers wide of dielectric material, for example, silicon dioxide or silicon nitride, are formed over the substrate 220 and around rectangles 222. Heat is applied to anneal the rectangle to balls 226, FIG. 22C, and whiskers 228, FIG. 22D, are grown of for example InP or GaAs. Alternatively a carbon-based material is used as the deposit 224 (a carbon based material stabilises the particle when the ball is formed by annealing, the dielectric material being desorbed). The balls are used as seed openings for bulk growth i.e. a layer of the desired material. The dielectric layer prevents atomic bonding and lattice mismatch effect between the substrate and the crystal layer. The whiskers grow together with a bulk layer of InP or GaAs 229, FIG. 22E. There are gradual changes in growth conditions from the whisker to the layer. Thus there is nucleation on the whiskers without creating defects. There are small nucleation steps and strain effects do not appear to give dislocations. Where the substrate is a III-V material, the important advantage is to create a lattice-mismatched layer on the substrate without getting misfit dislocations.

Figure 22F:
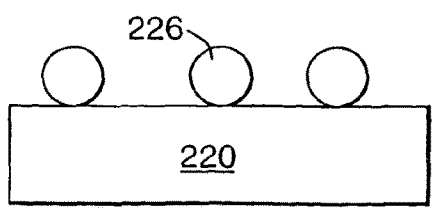
Figure 22G:
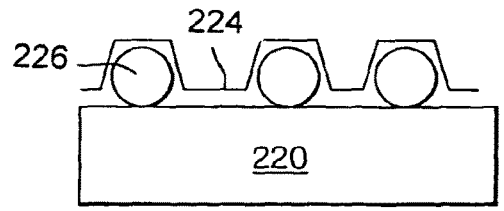

In a variation, as shown in FIG. 22F, gold balls 226 are deposited on the surface from an aerosol, in accordance with the method of Example 1. The epitaxial mask deposit 224 is formed over the balls. Whiskers are then grown, as in FIG. 22D.

In a further development in accordance with the invention, it is known that whiskers tend to grow preferentially in the <111>B direction because for gallium arsenide (a zinc blende lattice), the arsenic atom is at the apex of a pyramid with gallium ions at the base of the pyramid, see FIG. 23A. A preferred embodiment of the invention is illustrated in FIG. 23B, where a substrate 230 of silicon has a serrated surface having V-grooves 232 of microscopic dimensions etched to expose <111> planes. Gold particles 234 are deposited on the surfaces of the V-grooves. GaAs whiskers 236, shown in ghost form in FIG. 23C, and grown in accordance with Example 1, will extend perpendicular to the walls of the serrations. These whiskers provide nucleation points for bulk growth of a GaAs layer 238. There are gradual changes in growth conditions from the whisker to the layer. Thus there is nucleation on gallium arsenide without creating defects. Any small nucleation steps and strain effects do not appear to give dislocations. The direction of the whiskers, in <111> directions at an angle to the substrate, forces epitaxial growth in a certain direction, and takes away the problem of antiphase domains, which has been a problem. Thus this provides a way of integrating III-V compounds onto silicon (or other Group IV) substrates, and is cheaper than existing methods—see for example PCT Published Patent Application No. WO 02/01648.

A further advantage of a V-grooved substrate arises in connection with the solar cell application of FIG. 19, in that the serrated substrate provides multiple reflections of incident light, and hence an increased probability of photon capture.

Referring now to FIG. 24, a preferred embodiment is described for controlling the orientation of whiskers. Normally, as described above, whiskers of III-V compounds grow in the <111>B direction. A problem here is that such whiskers change more or less randomly between hexagonal (wurtzite) (FIG. 24A) and cubic (zinc blende) (FIG. 23A) structures. This gives rise to many stacking faults. Stacking faults are always a problem particularly for optical properties, but also for electrical characteristics. By applying strain to the whisker during formation, by change of growth conditions, the direction of growth of the whisker can be changed to the <100> direction, which gives a cubic lattice structure (zinc blende), which does not have stacking faults.

In FIG. 24B, a silicon substrate 240 with a <100> surface has whiskers 242 of, e.g., InP, grown on it. The whiskers start to grow as at 244 in the <111> direction, but shortly after initial growth, operating conditions are changed, by increasing the rate of growth and increasing the temperature and pressure within the CBE apparatus, so that the whisker continues to grow as at 246 in the <100> direction. The point 248 at which direction changes is a <110> facet. The whisker at the transition maintains its epitaxial crystalline nature. The structure of the crystal in segment 246 is hexagonal close packed, which significantly reduces the problem of stacking faults.

In an alternative method of growth, a short barrier segment of a wide band gap material, e.g. InAs, is grown at point 248; this has the same effect of changing the subsequent orientation of the whisker.

This embodiment is therefore particularly suitable for the growth of nitrides, e.g. GaN, which preferentially grow as hexagonal lattices, and which are particularly prone to stacking faults. By "forcing" the nitride crystal to grow in cubic form, stacking faults are reduced. Further, where structures are made in accordance with Example 2 with segments of different material along the whisker, microcavity structures for gallium nitride lasers can be developed. Nitride systems are quite well suited for whisker growth. The problem with nitrides is that they are filled with dislocations and the lack of suitable substrates. Whiskers can be made with defect-free nitrides, and the problem of lattice matching is not there. A regular FP laser can be made in a nanowhisker less than 300 nm length, of the order of 100 nm. It is a bottom up structure, which is well suited to reading and writing to DVDs.

Referring now to the embodiment shown in FIG. 25, this embodiment relates to field emission tips or Spindt cathodes. These are of use in field emission displays (FED), and many methods have been proposed for making such displays. One prior art arrangement as shown in FIG. 25A comprises a silicon substrate 250, with a surface 252, which is patterned by laser ablation, or the like, to form microscopic or nanometric tips 253. A phosphor screen 254 is positioned adjacent the tips, and a voltage between the tips and the screen generates extremely high field strengths at the tips, which causes current flow into the screen, and thus radiation of visible light from the screen.

In FIG. 25B, an embodiment of the invention is shown, comprising an FED, wherein the elements of the display are individually addressable. Etched contact metallisation areas 256 are formed on a silicon substrate 250. Gold seed particles 258 are positioned on each metallisation area, by the method as described in Example 1. The gold particles are used as seeds for whisker growth, in order to grow Si whiskers 259, each whisker extending from a respective metallisation area. A single whisker, as shown, or a group of nanowhiskers, forming a single display element may extend from a respective metallisation area. In addition to being individually addressable, an advantage of this embodiment is that the FED is 100% reliable, in contrast to prior methods, e.g. carbon nanotubes (CNT).

FIG. 26 discloses an embodiment for infrared to visible light up-conversion. An image 260 of infrared radiation with a wavelength of 1.55 or 2.5 µm is shone on the base surface of a gallium arsenide substrate 262—a relatively large band gap material which will not interact with the radiation. The other side of the substrate has indium arsenide projecting whiskers 264, grown as described in Example 1, and having a relatively small band gap, which will cause absorption of the photons of the radiation. Whiskers 264 are not however individually addressable, in contrast to FIG. 25. A voltage of about 20-50 volts is applied between the ends of the whiskers and a nearby fluorescent screen 266, and electrons are generated from the indium arsenide whiskers. Indium arsenide has a bandgap corresponding to 3 microns, and will therefore produce electrons in response to radiation shorter than 3 microns. Gallium phosphide may be used as an alternative, but this has a visible light bandgap. The emitted electrons cause fluorescence to give visible light 268 emitted from the fluorescent screen, and a version of the image, but up-converted to visible light wavelength. The applied voltage may be raised sufficiently to induce avalanche effects.

FIG. 27 discloses an embodiment of the invention in which a whisker 270, 400 nm long of GaAs (made in accordance with Example 1) extends from a metallisation contact area 272 on a silicon substrate 274. This dimension is ¼ of a wavelength of 1.55 micron radiation, and hence the whisker provides a ?/4 resonant antenna for 1.55 micron radiation. Contact area 272 provides a ground plane. The antenna may be positioned to receive radiation 276 in free space; alternatively, it may be positioned adjacent the end of a silica fibre link 278 for detection of radiation in the third optical window.

Referring now to FIG. 28, an embodiment of the invention is shown for use in the field of spintronics. Spintronics is a technical field where the properties of electronic devices rely on the transport of electron spin through the device—see for example Scientific American June 2002 pp 52-59, "Spintronics", David D. Awschalom et al. In FIG. 28, a whisker 280, formed by the process of Example 1, of a magnetic or semi-magnetic material such as manganese gallium arsenide (semi-magnetic) or manganese arsenide (ferromagnetic) is formed on a Si substrate 281. Under an applied voltage V, spin polarised electrons 283 are emitted from the tip of the whisker, which makes electrical contact with an electrical contact 284 disposed on a substrate 286. The spin polarised electrons 283 are used for reading and writing magnetic storage devices 288 disposed on substrate 286.

In a further development of this embodiment, a problem is overcome, which is that, with ferromagnetism, there is normally a lower limit on ferromagnetic domain width, about 10-15 nm, below which the ferromagnetism changes to super-paramagnetism. However when incorporated in a nanowhisker, in accordance with the method of Example 1, the domain diameter can be reduced, because of the reduced possibilities for symmetrical alignment in a 1-dimensional system, which makes it more difficult for the ions of the material to have more than one orientation. The material of the whisker can be iron, cobalt, manganese, or an alloy thereof.

Referring now to FIG. 29, a further embodiment of the invention is shown comprising a substrate with an array of electrodes for implantation into a nerve for repairing a nerve function, for example the retina of an eye. The electrodes are individually addressable. Etched contact metallisation areas 350 are formed on silicon substrate 352. Gold seed particles 354 are positioned on each metallisation area, by the method as described above. The gold particles are used as seeds for whisker growth, in order to grow silicon whiskers 358, each whisker extending from a respective metallisation area. A single whisker, as shown, or a group of nanowhiskers, forming a single electrode element may extend from a respective metallisation area. In addition to being individually addressable, an advantage of this embodiment is that the electrodes are 100% reliable.

Referring now to FIG. 30, a further embodiment is shown comprising a nanowhisker 360 formed by the method described above. The whisker is formed of silicon and has a gold particle melt at one end 362. Subsequent to formation of the whisker, the whisker is exposed to an atmosphere at a suitable temperature for oxidation of the silicon. This forms an outer shell 364 of silicon dioxide surrounding the whisker and extending along its length. The gold particle melt 362 remains in an unoxidised condition. This therefore provides a structure highly suitable for the electrode assembly shown in FIG. 29, wherein the electrode has very precise electrical characteristics. The silicon material may be replaced by any other material that can be oxidised.

As an alternative, the whisker 360 may be exposed to an atmosphere of a suitable material for forming a high band gap material as an alternative to the oxidation layer 364.

Referring now to FIG. 31, this shows a further embodiment of the invention comprising a silicon base member 370. This base member may be a planar substrate, or just a bar. In any event, a row of nanowhiskers 372 is formed from one edge surface of the bar or substrate. The nanowhiskers are regularly spaced apart and project into space. The nanowhiskers may have a coating formed on them for absorbing certain molecular structures. In any event the cantilever beam arrangement may be used for any of the well-known applications for cantilever arrangements for measuring molecular species etc.

Referring to FIG. 32 this shows a further embodiment of the invention comprising a molecular sensing device. A substrate 380, e.g., of silicon nitride, has an insulating layer 382 formed thereon, with a conductive surface 384, for example gold. An aperture 386 is formed within the layers 382, 384 and a nanowhisker 388 is formed within the aperture.

This is done essentially by a self-assembly process, since the aperture is formed in insulating layer 382 and the gold layer 384 is subsequently deposited. Gold is therefore in consequence deposited on the base of the aperture, indicated at 389, and upon heating forms a gold particle melt which enables formation of a nanowhisker with appropriate conditions. The gold particle melt 389 resides on top of the nanowhisker in the finished nanowhisker. The nanowhisker height is such that the particle melt 389 is at least approximately co-planar with the gold surface layer 384.

The natural resilience of the nanowhisker implies that it has a characteristic frequency of vibration from side to side in a direction transverse to its length. Oscillation of particle melt 389 can be detected by voltage or current signals being created in conductive layer 384. This therefore provides a means of detecting the frequency of vibration of the nanowhisker 388.

By appropriate activation of the conductive material with an applied voltage, the whisker may be made to mechanically vibrate within the aperture at a certain eigen frequency, for example, in the gigahertz range. This is because, in view of the small dimensions and low currents involved, during the period of a single vibration, a single electron is transferred from one side of the conductive material to the other via the seed particle melt. This creates a current standard generator, where the current I through the conductive material is equal to product of the frequency of vibration f and the charge e of an electron: $I=f \cdot e$. Thus a known reference signal is generated which can be used in appropriate circumstances.

In addition, the particle melt 389 may be coated with a receptor substance so as to permit certain molecular species to be absorbed on the surface of the particle melt 389. This will cause a change in characteristic frequency of the nanowhisker. This change in frequency may be detected and provides a means of computing the weight of the molecular species absorbed on the surface of the melt 389.

FIG. 33 shows the tip of a Scanning Tunneling Microscope (STM) as comprising a nanowhisker 392 of InP formed on the end of a flexible beam 394 of Silicon. Beam 394 is formed by etching from a substrate or bar.

The invention claimed is:

1. A solar cell comprising:
   an electrically conducting substrate;
   a plurality of nanowhiskers extending from said substrate, each nanowhisker having a column with a diameter of nanometer dimension, the column comprising a first p-doped semiconductor lengthwise segment and a second n-doped semiconductor lengthwise segment, said first and second semiconductor segments having an interface therebetween forming a p-n junction,
   sides of the first and second semiconductor segments of the nanowhiskers being encapsulated in a transparent plastic material; and
   a transparent electrode extending over free ends of the whiskers and making electrical contact therewith,
   wherein each nanowhisker comprises a plurality of lengthwise p-n junction semiconductor segments, said semiconductor segments being selected to form a plurality of p-n junctions that absorb a plurality of different wavelengths of solar radiation.

2. The solar cell of claim 1, wherein a diameter of the nanowhiskers is such that the nanowhiskers exhibit quantum confinement effects.

3. The solar cell of claim 1, wherein a diameter of the nanowhiskers is less than 500 nm.

4. The solar cell of claim 3, wherein a diameter of the nanowhiskers is less than 100 nm.

5. The solar cell of claim 4, wherein a diameter of the nanowhiskers is less than 50 nm.

* * * * *